(12) United States Patent
Meinhart

(10) Patent No.: US 10,178,792 B2
(45) Date of Patent: Jan. 8, 2019

(54) ONE-PERSON PORTABLE COMMAND AND CONTROL DATA CENTER

(71) Applicant: The United States of America, as represented by the Secretary of the Navy, Washington, DC (US)

(72) Inventor: Michael A Meinhart, Washington, IN (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 15/954,444

(22) Filed: Apr. 16, 2018

(65) Prior Publication Data

US 2018/0303003 A1 Oct. 18, 2018

Related U.S. Application Data

(60) Provisional application No. 62/485,477, filed on Apr. 14, 2017.

(51) Int. Cl.
| | |
|---|---|
| *G06F 1/16* | (2006.01) |
| *H05K 7/14* | (2006.01) |
| *G06F 1/18* | (2006.01) |
| *G06F 1/20* | (2006.01) |
| *H05K 7/20* | (2006.01) |
| *H05K 5/02* | (2006.01) |

(Continued)

(52) U.S. Cl.
CPC ......... *H05K 7/1487* (2013.01); *G06F 1/1601* (2013.01); *G06F 1/182* (2013.01); *G06F 1/184* (2013.01); *G06F 1/189* (2013.01); *G06F 1/20* (2013.01); *G06F 8/61* (2013.01); *H04K 3/224* (2013.01); *H05K 5/023* (2013.01); *H05K 7/1498* (2013.01); *H05K 7/16* (2013.01); *H05K 7/20772* (2013.01); *G06F 2200/1612* (2013.01); *G06F 2200/201* (2013.01); *H05K 7/20263* (2013.01); *H05K 7/20272* (2013.01)

(58) Field of Classification Search
CPC .............................. G06F 1/1601; G06F 1/1615
See application file for complete search history.

(56) References Cited

U.S. PATENT DOCUMENTS

| | | | | |
|---|---|---|---|---|
| 6,222,507 B1 * | 4/2001 | Gouko | .................. | G06F 1/1601 345/1.1 |
| 8,083,189 B2 * | 12/2011 | Sun | ........................ | F16M 11/08 248/122.1 |

(Continued)

*Primary Examiner* — Anthony Q Edwards
(74) *Attorney, Agent, or Firm* — Christopher A. Monsey

(57) ABSTRACT

A command and control system and related methods are provided including an integrated shipping case/equipment mounting structure, a multi-application information fusion work station, a communication system, an expandable display array, a location determining system, and a data center section with data servers and network hub capability. Embodiments of the system includes design configurations enabling operation with reduced or passive environmental and temperature control capabilities including a compact cooling system usable with a compact layout and close proximity components that provide needed low power consumption cooling capability. Embodiments provide a portable, compact, rapid employable, reduced power consumption and lightweight information command and control capability operable in austere environments.

23 Claims, 41 Drawing Sheets

(51) Int. Cl.
*G06F 8/61* (2018.01)
*H04K 3/00* (2006.01)
*H05K 7/16* (2006.01)

(56) References Cited

U.S. PATENT DOCUMENTS

2003/0015632 A1* 1/2003 Dunn .................. A47B 81/065
                                              248/122.1
2004/0195471 A1* 10/2004 Sachen, Jr. ............ F16M 11/10
                                              248/127

* cited by examiner

Closed Video Monitors

Deployed Video Monitors

SIDE VIEW

Network Penetration Testing Optimized System

Air Traffic Control Optimized System

Optimized for Gaming Network step 914 determining a design structure for a sealed liquid cooling system capable of maintaining the components within the thermal limits in air with an ambient temperature less than 81.2C, comprising a quantity of heat transferfluid, a radiator having a plurality of pipe coupling ports, a first fluid input pipe, a second fluid input pipe, a first fluid output pipe, a second fluid output pipe, a first heat sink and pump, a second heat sink and pump, a third heat sink and pump, and a plurality of wires configured to transmit an activation signal from the motherboards; wherein the fluid input pipes and the fluid out put pipes are coupled to the radiator pipe coupling ports, the first heat sink and pump is disposed in contact with the first central processing unit, the second heat sink and pump is disposed in contact with the second central processing unit, the first and second heat sink and pumps are coupled to the first fluid input pipe, to the first fluid output pipe, and to a portion of the wires, the third heat sink and pump is disposed in contact with the workstation central processing unit; the third heat sink and pump is coupled to the second fluid input pipe, to the second fluid output pipe, and to a portion of the wires

↓ step 915 optimizing the liquid cooling system so as to allow a quantity of waste heat to pass from the central processing units to a portion of the heat transfer fluid, the portion of heat transfer fluid to be transported within the fluid input pipes to the radiator, the radiator being configured to allow a quantity of waste heat to pass from the portion of heat transfer fluid to a portion of proximal ambient air, the portion of heat transfer fluid to be transported within the fluid output pipes to the heat sinks and pumps

↓ step 916 selecting a disposition location within the case for the radiator so as to enable the radiator to passively power a convection current as the heated portion of proximal air rises within the case and exists th case through a plurality of non-specific breaches and a portion of cooler ambient temperature air is drawn through an additional quantity of non-specific breaches in a lower portion of the second vertical side to fill a resultant low pressure area proximal to the radiator

↓ step 917 selecting a software suite optimized for the desired command and control capability set

Figure 22C step 1415 installing an air traffic control application configured to provide track prediction, conflict probe and alert functionality, resolution advisories, minimum safe altitude advisory warnings, and time-based arrival and departure metering installing a data recording, reduction and analysis application configured to record and facilitate analysis of any and all aircraft flight, track, display, and controller input, internal process functionality, interprocess communication, inter-center and inter-tracon communications

Figure 27B

ONE-PERSON PORTABLE COMMAND AND CONTROL DATA CENTER

CROSS-REFERENCE TO RELATED APPLICATIONS

This patent application claims the benefit of U.S. Provisional Application No. 62/485,477, titled MAN-PORTABLE COMMAND AND CONTROL DATA CENTER, filed Apr. 14, 2017, the disclosure of which is expressly incorporated by reference herein.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon. This invention (Navy Case 200,426) is assigned to the United States Government and is available for licensing for commercial purposes. Licensing and technical inquiries may be directed to the Technology Transfer Office, Naval Surface Warfare Center Crane, email: Cran_CTO@navy.mil.

BACKGROUND AND SUMMARY OF THE INVENTION

The present invention addresses a need for a compact, one-person portable data center with the ability to provide situational awareness and a communication infrastructure in a variety of austere environments and situations. Such environments or situations could include disaster response, military command and control, post network attack response, or other situations requiring temporary robust computing power, various network interfaces, and an optimized software suite. Current technology is limited in mobility by expansive server structures. Most embodiments utilize multiple servers and workstations integrated into a rack. These racks can be tall, large, and extremely heavy to move. Moving such a system can require a forklift or other heavy equipment, and as a result are often truck mounted. Other, more "portable" embodiments still can require four or more people to move.

In addition to the physical size of current technology, the individual components generate a significant quantity of heat which must be removed in order to prevent component overheating and failure. Current technology typically addresses this requirement by employing powerful air conditioning. A reliance on external air conditioning units only increases the logistical burden of such units therefore is to be avoided.

Exemplary system enable a variety of capabilities include advanced analytics tool development, embedded mentors in a field or austere setting, data center operation and infrastructure and data normalization, data warehousing, development of virtual machine-enabled systems for tactical deployments, cloud and service-oriented architecture (SOA) technologies, development of advanced motion imagery video systems and tools, cybersecurity and multi-level security solutions, ability to connect multiple thin clients to the system for multiple system analyst usage, and ability to connect and ingest multiple sensor feeds without delay.

Embodiments can also help deliver robust performance, scalability and reliability with ample power, memory and input/output (I/O) bandwidth of an exemplary system server and workstation all in a highly compact, portable, and lower power consumption system with ability to operate in a wide variety of thermal environments. Exemplary server sections can include dual Intel Xeon processor (s) with 256 Gb memory, gigabit network interface x2, 40 Tb Solid State Hard Drive Space, RAID, and other features (Fiber is available). An exemplary compact workstation can include an Intel Xeon® processor with 128 Gb memory, GeForce Quadro Pro® PCIE Video Card, Gigabit network interface x2, RAID and 24 Tb Solid State Hard Drive Space. Exemplary workstation and server sections can accommodate Windows® or Linux® operating systems as well as other operating systems. Exemplary workstation and server can accommodate VMWare® ESXi 3×21" hinged monitors foldable, Keyboard and Mouse. Exemplary systems can include 110 AC 15 amp portable power systems to operate an embodiment. One embodiment's dimensions can be 15.3×21.1×11.7-inches (H×W×D) closed; 15.3×59.1×11.7-inches (H×W×D) Deployed (fully open). One embodiment's total weight of system can be approximately 48 lbs.

A variety of software application packages can be included which enable various mission sets such as perimeter defense, disaster response, and field activities which require a common operating picture (COP) and different visual systems including a control system, a map system with map overlays, and a status or information feed system on exemplary fold out video monitors that are integrated into an exemplary case structure.

BRIEF DESCRIPTION OF THE DRAWINGS

The detailed description of the drawings particularly refers to the accompanying figures in which:

FIGS. 22A, 22B and 22C show an exemplary method for designing a person-portable command and control data center;

FIGS. 27A and 27B show an exemplary method for optimizing a one-person-portable command and control data center to establish air traffic control.

DETAILED DESCRIPTION OF THE DRAWINGS

Embodiments of the invention described herein are not intended to be exhaustive or to limit the invention to precise forms disclosed. Rather, the embodiments selected for description have been chosen to enable one skilled in the art to practice the invention.

Figure 1A:
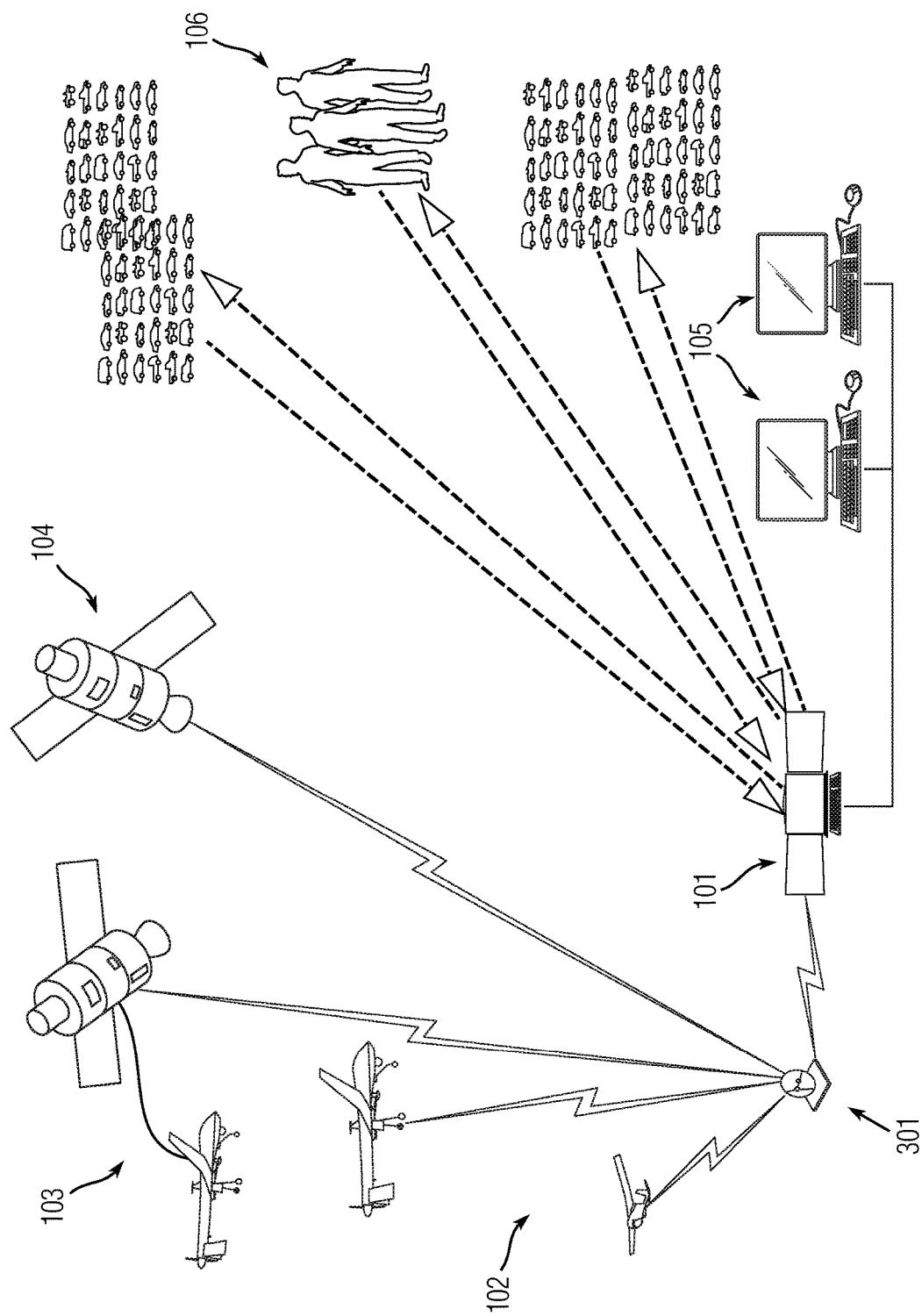
FIG. 1A shows a person-portable command and control data center in a deployed configuration.
Figure 9:
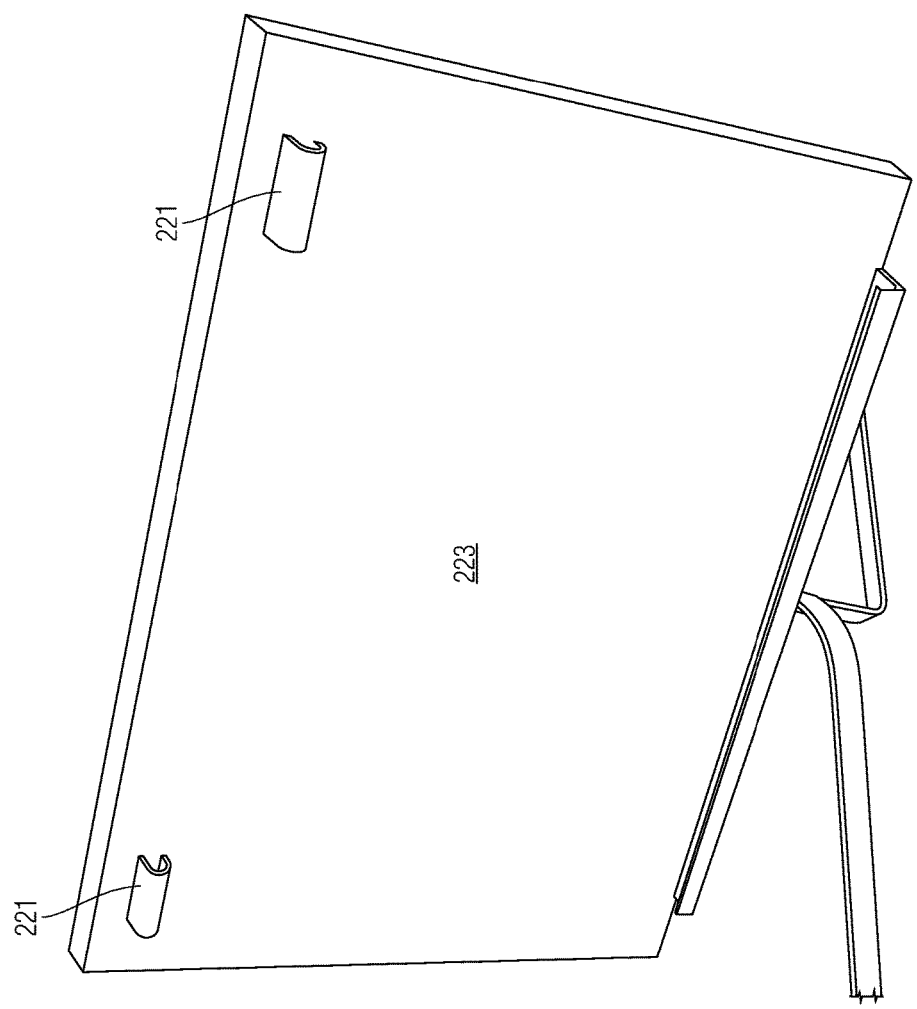
FIG. 9 shows a close up view of a second hinged monitor support plate.
Figure 10:
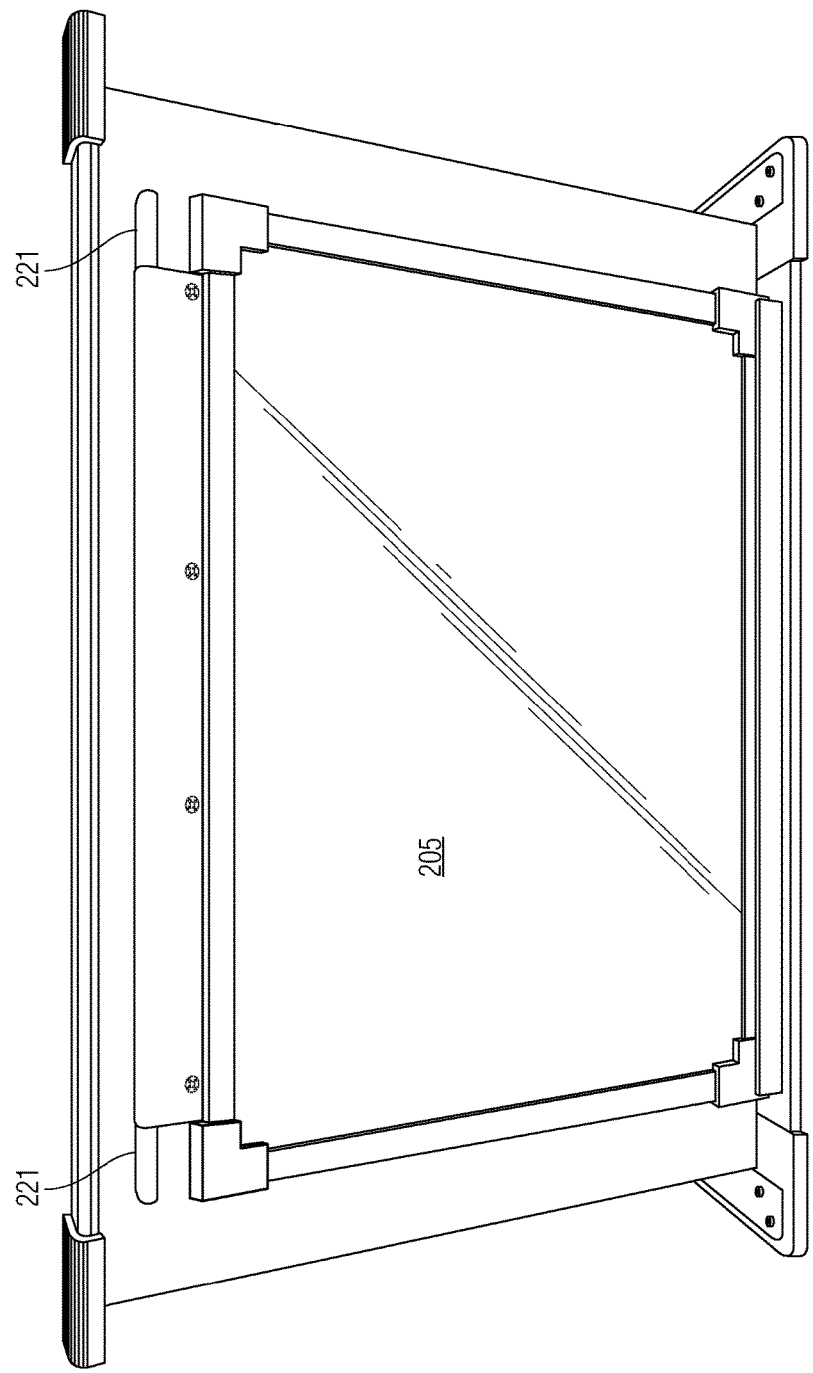
FIG. 10 shows a keyboard in a stowed configuration on the second hinged monitor support plate in a closed position.
Figure 11:
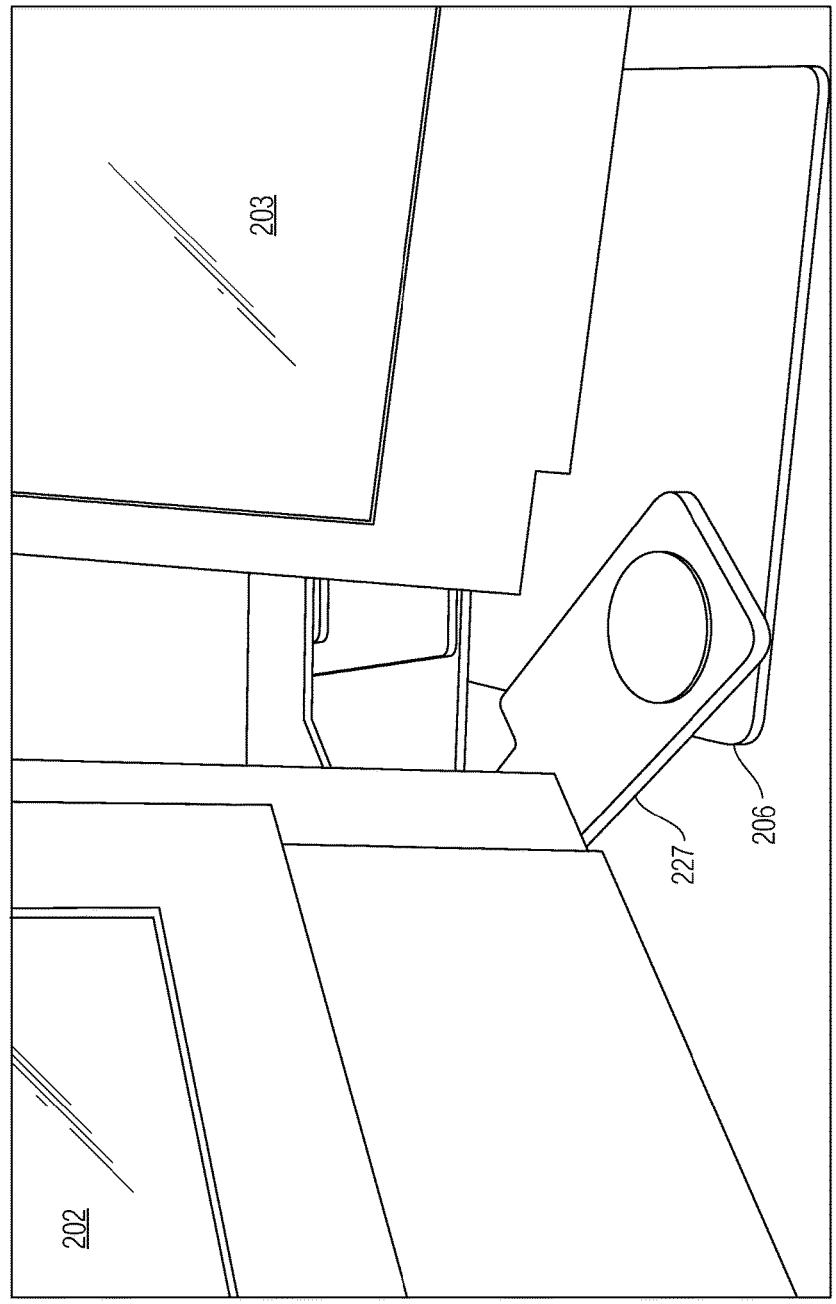
FIG. 11 shows an exemplary pivot hinge

Referring initially to FIG. 1A, an embodiment of the invention is shown deployed in a configuration optimized for command and control. A person-portable command and control data center 101 comprises a workstation motherboard 402 (as seen in FIGS. 9 and 10) and a server motherboard 403 (as seen in FIGS. 9, 10 and 11) contained within a single enclosure. The exemplary enclosure is configured to weigh less than fifty pounds and be transported in one hand by a single individual. The person-portable command and control data center 101 is coupled a wideband ground communication antenna 301. In the shown configuration, the person-portable command and control data center 101 is capable of receiving imagery and other data directly from unmanned aerial systems operating within line-of-site 102 of the wideband ground communication antenna 301. For unmanned aerial systems operating over the horizon 103, imagery and data may be relayed to the person-portable command and control data center 101 via satellite. Additionally, connections to various communications satellites enable the person-portable command and control data center 101 to receive data from anywhere around the world. Various external antennas (not shown but see, e.g., FIG. 1C) allow the person-portable command and control data center 101 to track and communicate with various fielded assets 106. Connecting additional client workstations 105 to the person-portable command and control data center 101 allows more operators to leverage the information, computing power, and communication systems of the person-portable command and control data center 101, thereby increasing command and control.

Figure 1B:
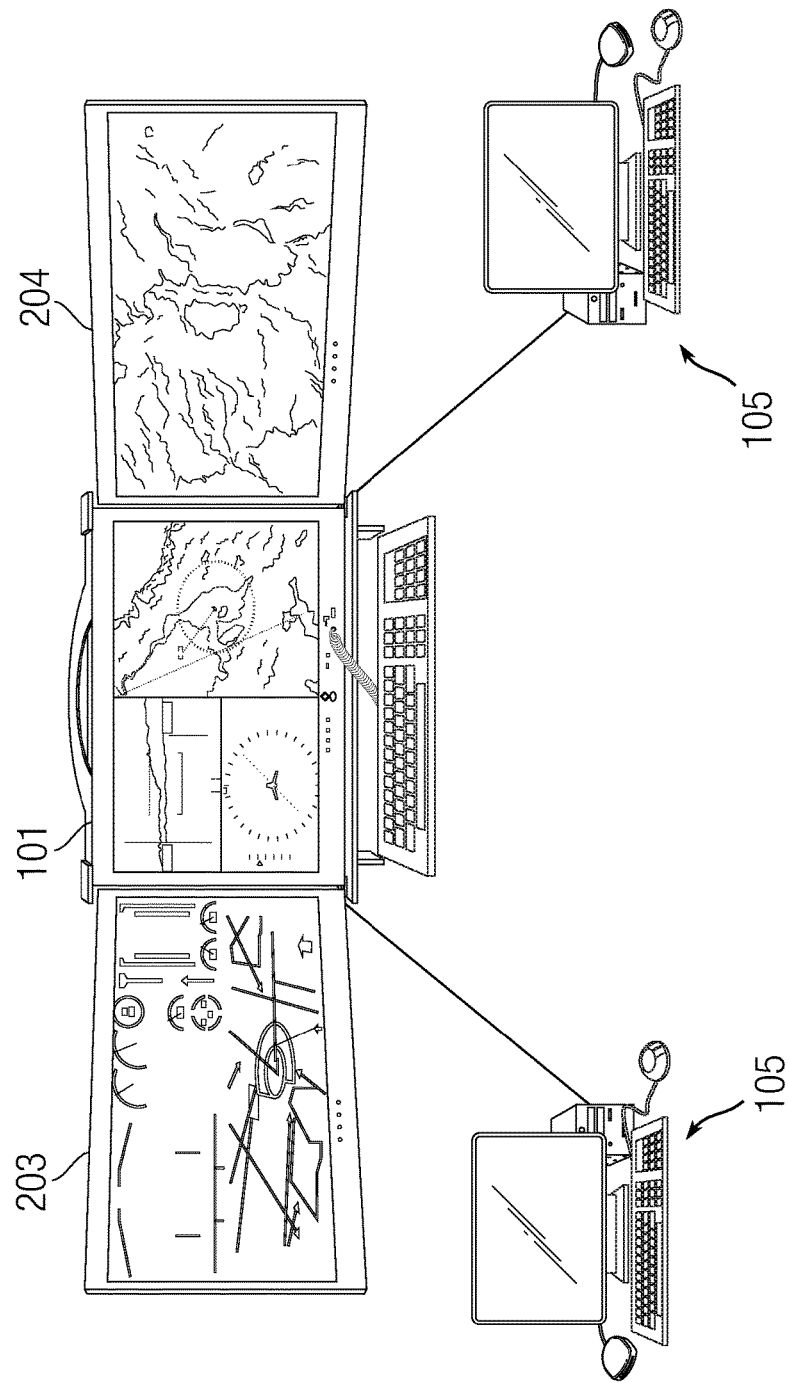
FIG. 1B shows a closer frontal view of the person-portable command and control data center in a deployed position along with two coupled thin-clients terminals and video monitors.

FIG. 1B shows a closer frontal view of the exemplary person-portable command and control data center 101 with video monitors 203, 204 in an open or deployed position. Various applications of different types are displayed on the video monitors along with two coupled thin-clients terminals with video monitors 105.

Figure 1C:
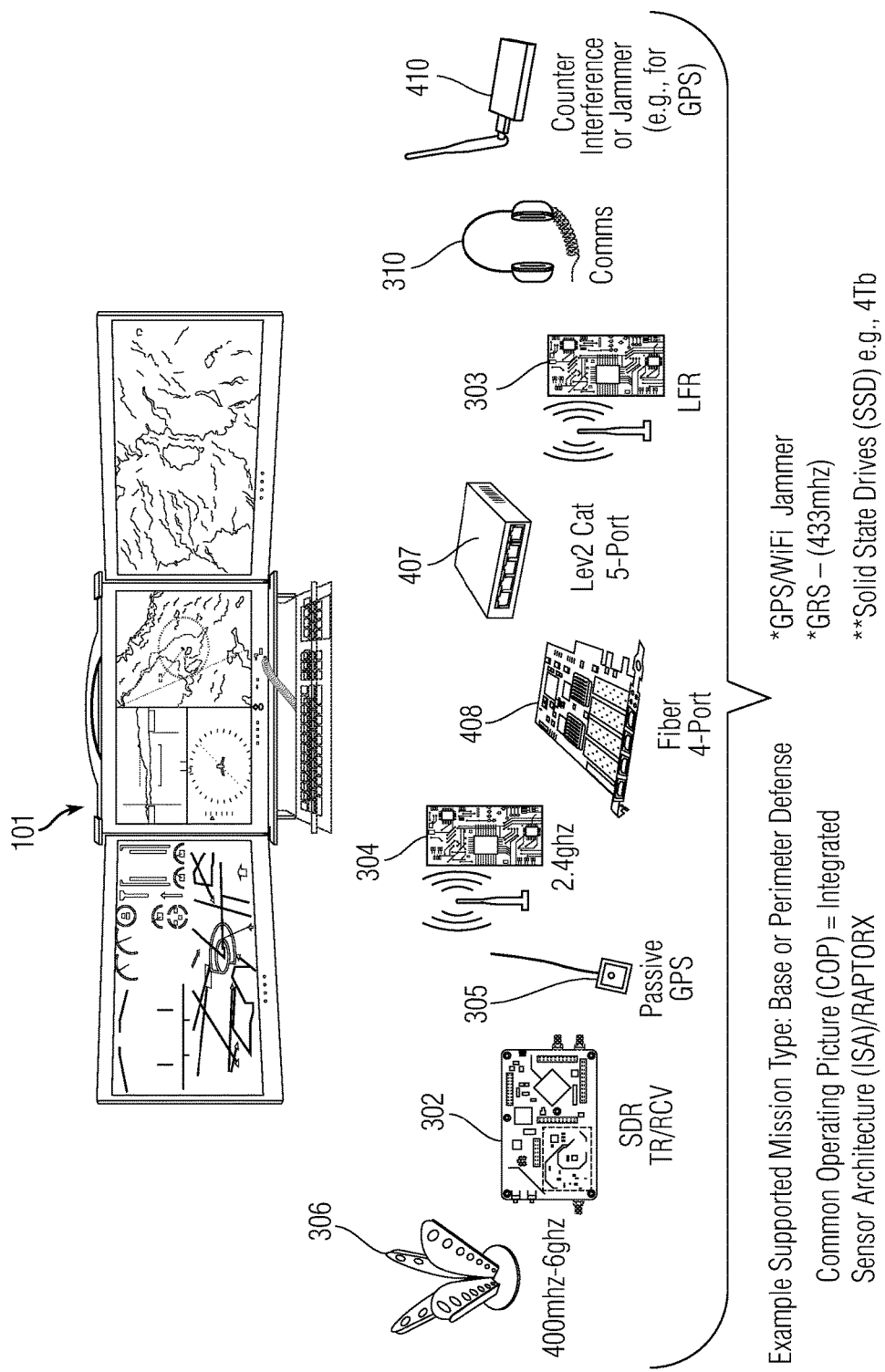
FIG. 1C shows a frontal view of the exemplary person-portable command and control data center with various internal or external components associated with one exemplary supported mission (e.g., a base or perimeter defense mission)

FIG. 1C shows a frontal view of the exemplary person-portable command and control data center 101 with various internal or external components associated with one exemplary supported mission (in this example, a base or perimeter defense mission). In particular, an antenna 306 (e.g., a 400 mhz-6 ghz), a software defined radio (SDR) transmitter/receiver card 302 coupled with the 400-6 ghz antenna 306, a passive GPS antenna 305 coupled with an internal GPS system (not shown), a 2.4 Ghz antenna 304 coupled to another transmitter/receiver (not shown), a fiber optic cable 4 port system 408, a lev2 Cat 5 5-port system 407, a low frequency radio (LFR) 303, an operator headset 310 with headphones and microphone, and a counter interference or jammer system 410 (alternatively a Wi-Fi counter jammer system). Internal server capability (not shown) can include solid state drives in excess of 4 terabytes (TB). The exemplary person-portable command and control data center 101 is shown with extended video monitors displaying a Common Operating Picture (COP) comprised of an Integrated Sensor Architecture (ISA) including an exemplary cursor on target system such as RAPTORX.

Figure 2:
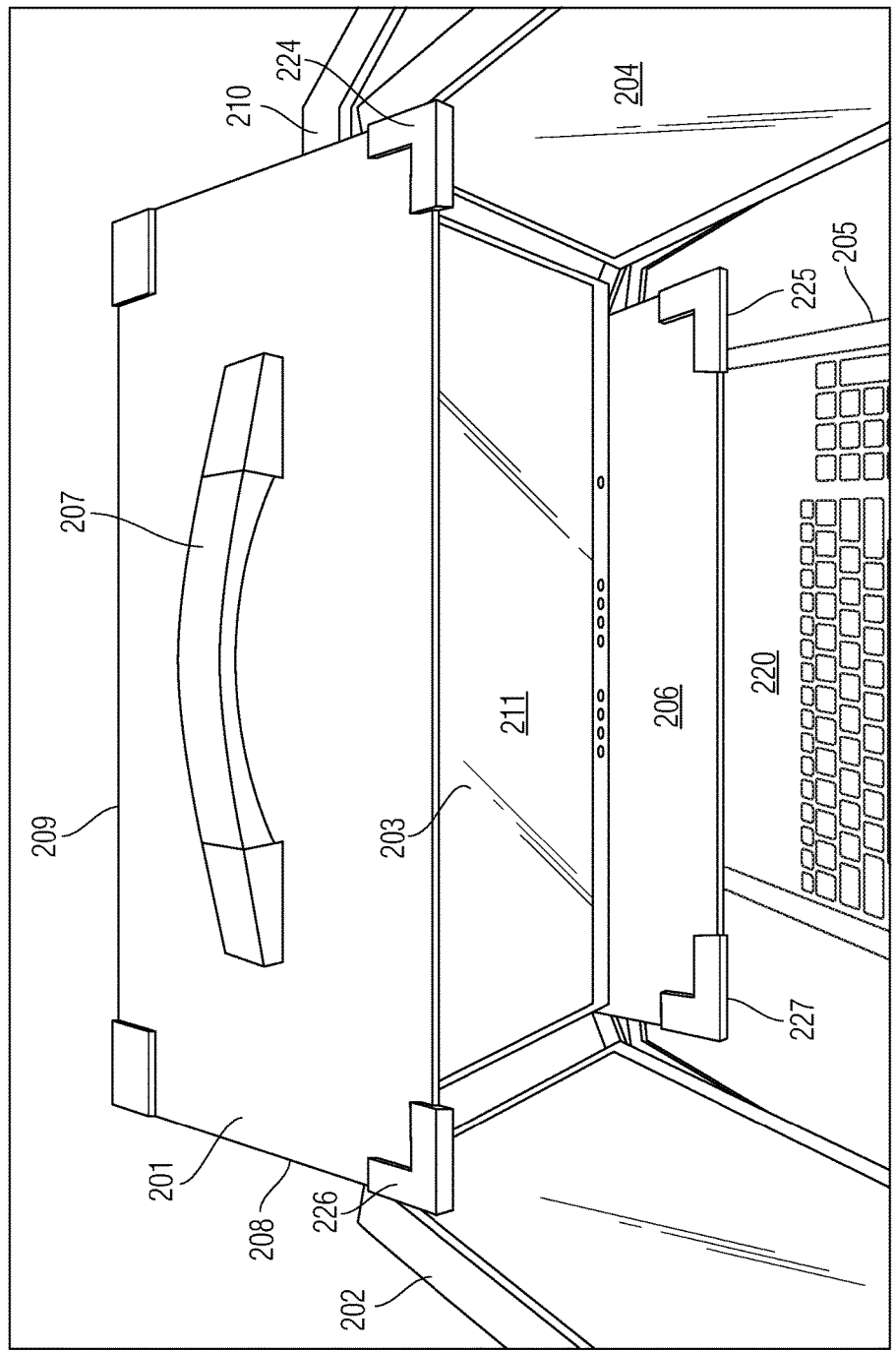
FIG. 2 shows an external view of the person-portable command and control data center from a user's perspective.

FIG. 2 shows an external view of the person-portable command and control data center 101 from an operator's perspective. A case assembly is formed by a horizontal top 201 formed opposite a horizontal bottom 206, a first vertical side 208 coupled to an edge of the horizontal top 201 and an edge of the horizontal bottom 206, a second vertical side 210 opposed opposite the first vertical side 208 and coupled to the horizontal top 201 and the horizontal bottom 206, a vertical back plate 209 (not visible) coupled to the horizontal top 201, the horizontal bottom 206, the first vertical side 208, and the second vertical slide 210, a vertical front plate 211 (not visible) disposed opposite the vertical back plate 209 coupled to the horizontal top 201, the horizontal bottom 206, the first vertical side 208, and the second vertical slide 210. A carrying handle 207 is secured to the horizontal top 201 at a determined balance point.

FIG. 2 further shows a first monitor 203 secured to a monitor bracket (not shown) which in turn is coupled to vertical front plate 211. The first monitor 203 is connected to a first 3D video card (not shown), and connected to a user configurable power supply (not shown). The case has a height of 1.06 times the first monitor 203 height, a length of 1.08 times the first monitor's 203 length, and a depth of 11.25 times the first monitor's 203 depth. A second monitor 204 is secured to a first hinged monitor support plate (not shown but behind and supporting the second monitor 204) which is coupled by a first pivot hinge 224 to an interior face of the horizontal top 201, by a second pivot hinge 225 to an interior face of the horizontal bottom 206. The second monitor 204 is connected to the first 3D video card (not shown), and connected to the user configurable power supply (not shown). The first hinged monitor support plate (not shown) is configured to be folded through an arc from an extend position in line with the first monitor 203, toward the first monitor 203, to a position parallel to, and in contact with the first monitor 203, creating a first closed position. A third monitor 202 is secured to a second hinged monitor support plate (not shown but behind and supporting the third monitor) which is coupled by a third pivot hinge 226 to the interior face of the horizontal top 201, by a fourth pivot hinge 227 to the interior face of the horizontal bottom 206. The third monitor 202 is connected to the first 3D video card, and to the user configurable power supply. The second hinged monitor support plate is configured to be folded through an arc from an extend position in line with the first monitor 203, toward the second monitor 204 to a position parallel to, and in contact with the second monitor 204 in the first closed position, creating a second closed position. A removable keyboard 205 is also shown comprising a plurality of locking pins 220 disposed so as to penetrate a matching plurality of support fixtures (not shown) and create a secure coupling between the keyboard 205 and the second hinged monitor support plate.

Figure 3:
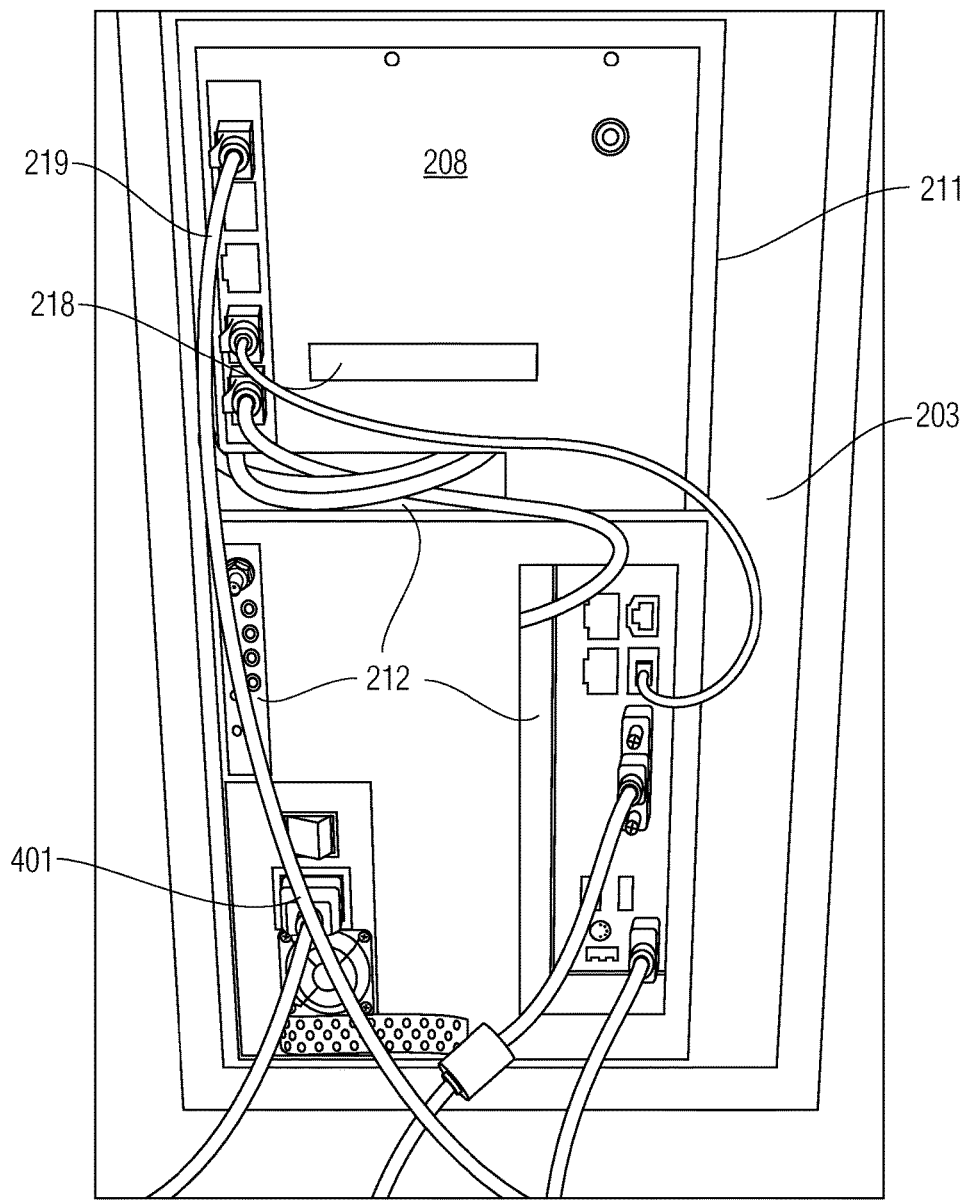
FIG. 3 shows a close up view of a first vertical side of the person-portable command and control data center.

FIG. 3 shows a close up view of the first vertical side 208 in orientation with the vertical front plate 211 which the first monitor 203 (middle monitor) mounts to. In this view, an edge of the first monitor 203 is shown mounted to the vertical front plate 211. From a user's perspective, when looking at the monitors, this side would be to the user's left. The first vertical side 208 is formed with a plurality of apertures 212. A user configurable power supply 401 is coupled to an inner face of the case and configured to accept a variety of power inputs and convert the inputs into an output signal with a waveform of 110 v at 60 Hz and 15 amps. Additional apertures are formed to create a CAT-5 access port 219 and a fiber card access port 218.

Figure 4:
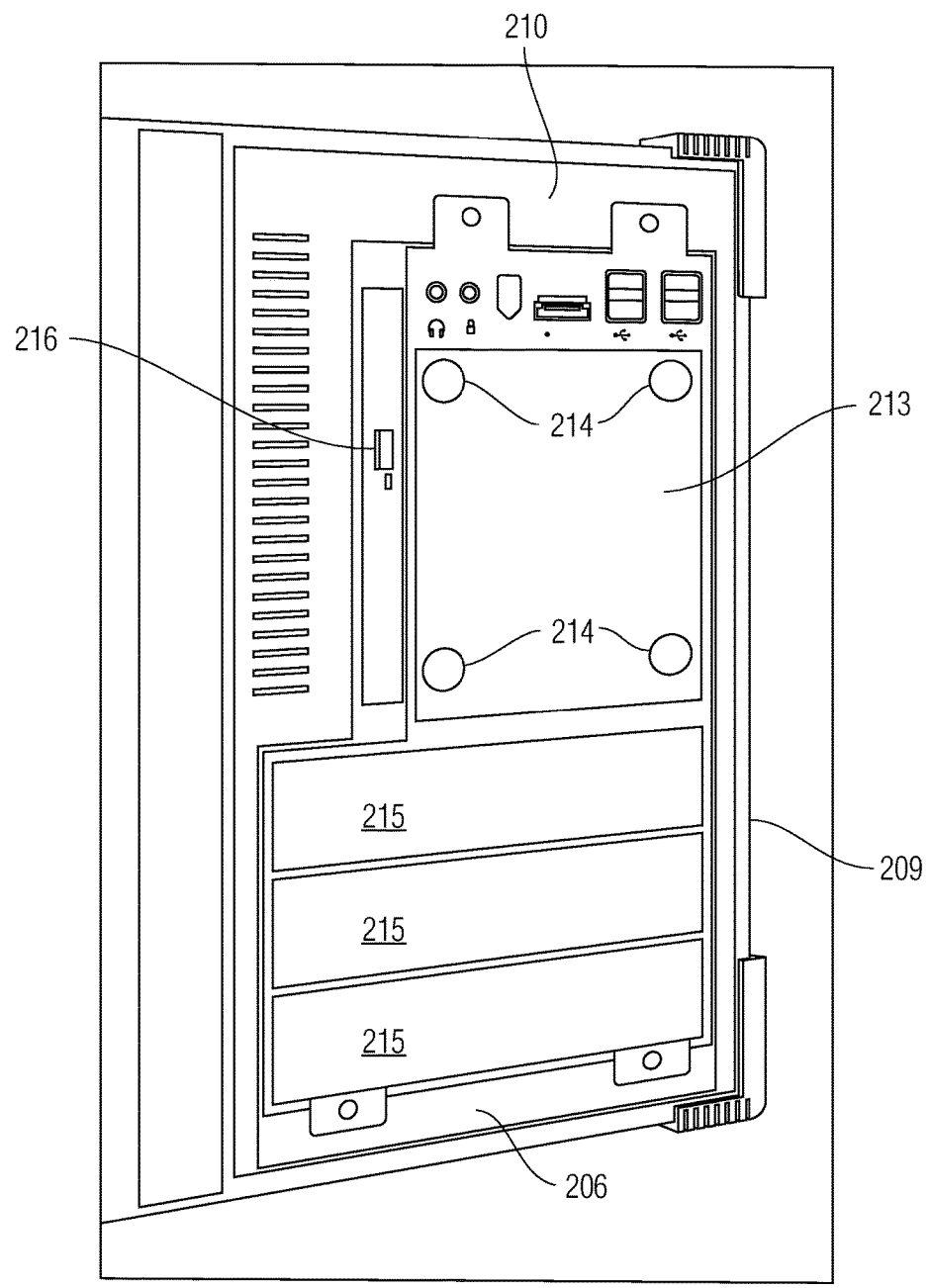
FIG. 4 shows a close up view of a second vertical side of the person-portable command and control data center.

FIG. 4 shows a close up view of the second vertical side 210 in orientation with the vertical back plate 209 and the horizontal bottom 206. From a user's perspective, when looking at the monitors, this side would be to the user's right. A data storage device cover 213 is secured by a plurality of quick release mechanisms 214 adjacent to a DVD drive 216. Three 5¼ drive bay covers 215 conceal a liquid cooling system radiator (not shown).

Figure 5A:
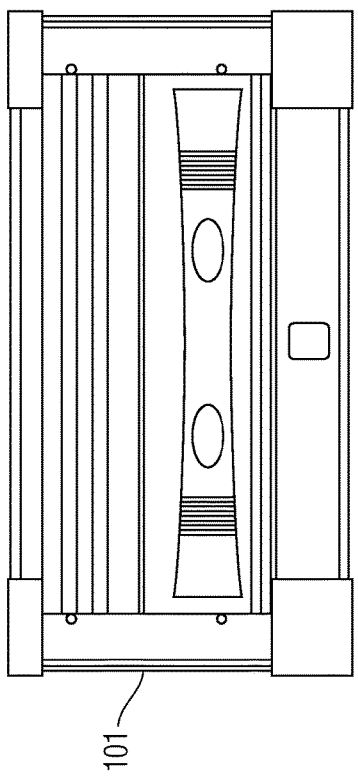
FIG. 5A shows a top view of the exemplary person-portable command and control data center showing hinged monitor support plates in a stowed position.

FIG. 5A shows a top view of the exemplary person-portable command and control data center 101 showing first and second hinged monitor support plates 222, 223 (not shown) with respectively supported video monitors 202, 204 (not visible) in a stowed position.

Figure 5B:
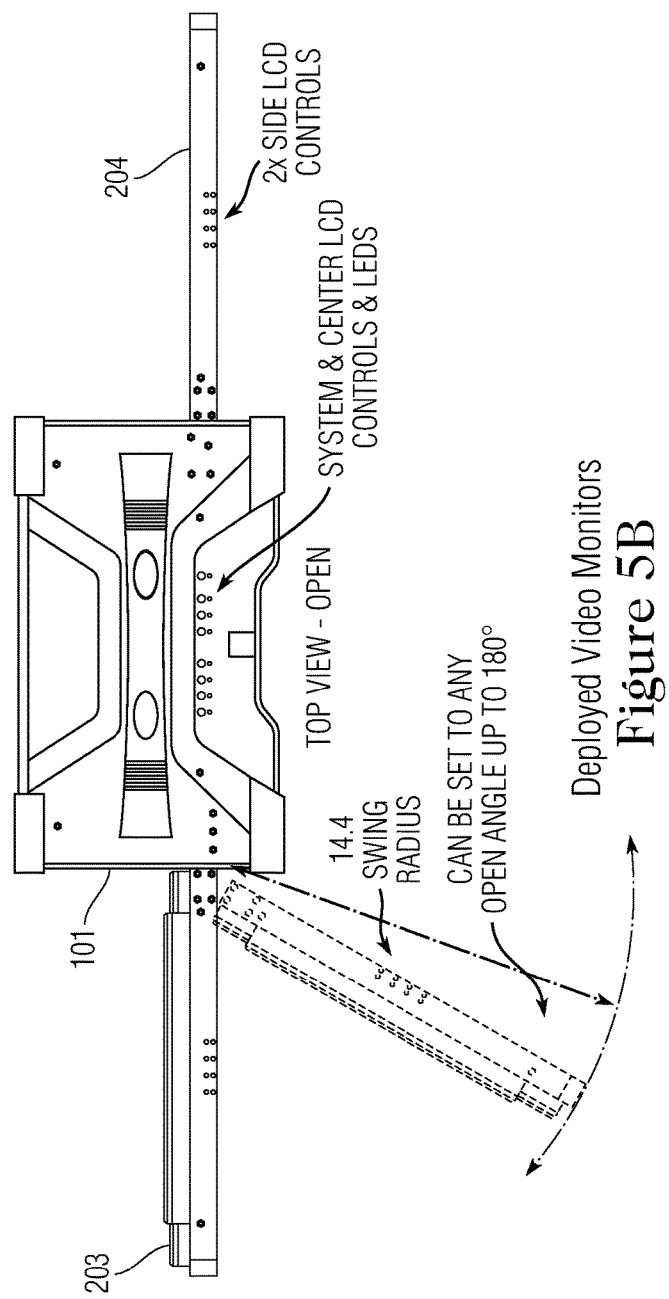
FIG. 5B shows a top view of the exemplary person-portable command and control data center with the hinged monitor support plates in an open or pivoted out position.

FIG. 5B shows a top view of the exemplary person-portable command and control data center 101 with first and second hinged monitor support plates 222, 223 that respectively supported video monitors 202, 204 in an open or pivoted out position.

Figure 6:
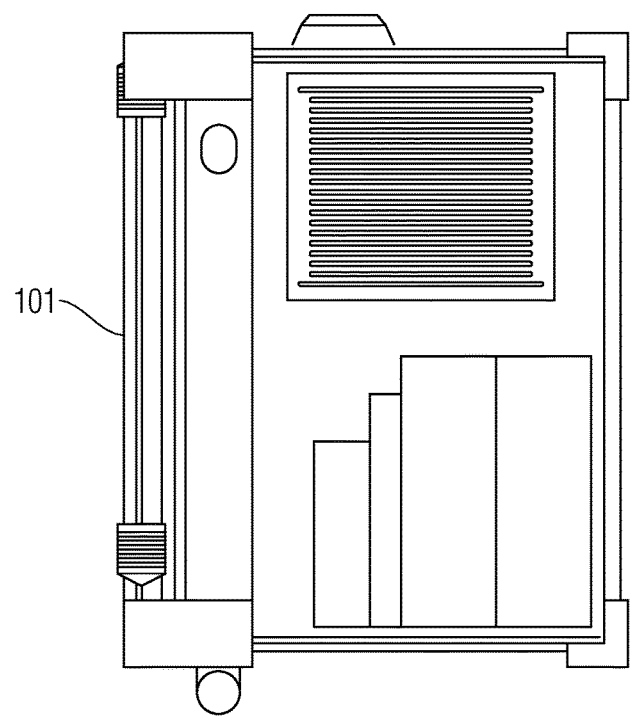
FIG. 6 shows a side view of the exemplary person-portable command and control system showing the hinged monitor support plates in a stowed position and a view of various component interface ports.

FIG. 6 shows a side view of the exemplary person-portable command and control system 101 showing a first and second hinged monitor support plates 222, 223 with respectively supported monitors 202, 204 in a stowed position and a view of various component interface ports.

Figure 7:
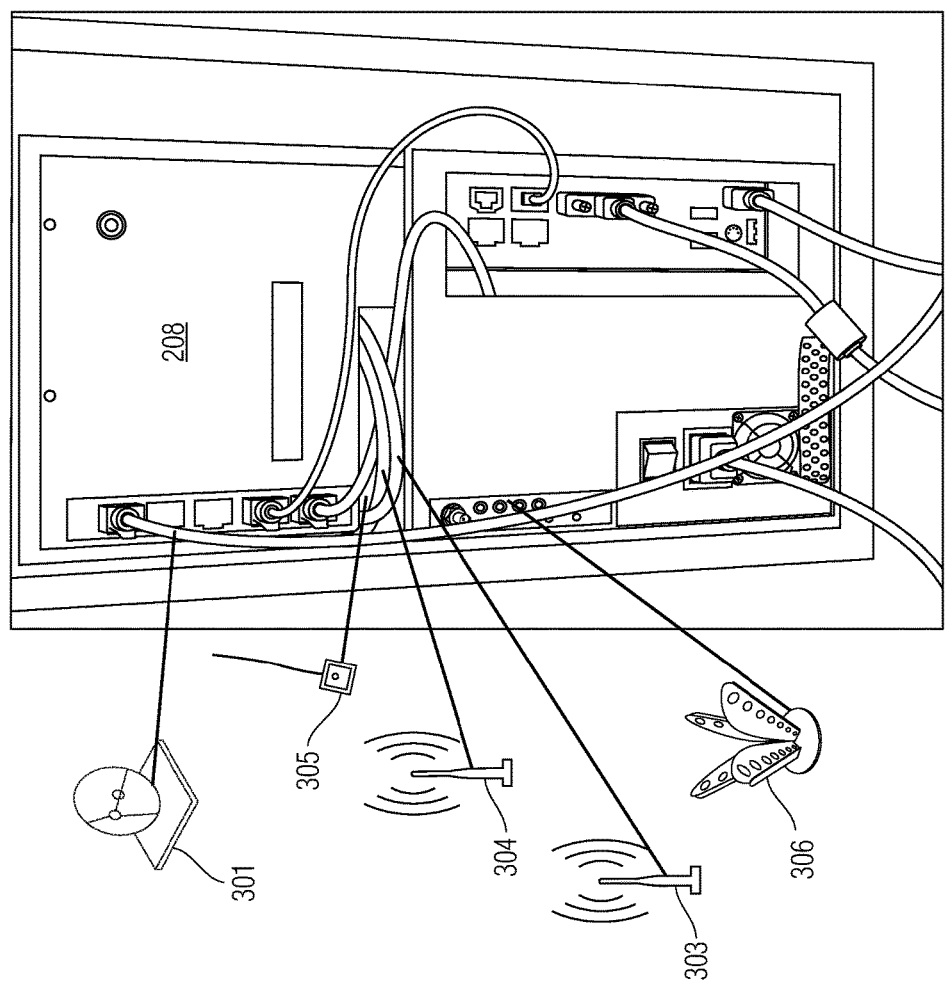
FIG. 7 shows exemplary external components coupled to internal components through various apertures in the first vertical side.

FIG. 7 shows an exemplary set of various external antennas which may be coupled to the person-portable command and control data center 101 to create data links and establish communications networks. A first radio antenna 306 formed with a plurality of antenna elements is connected to a radio transceiver antenna port for a software SDR transmitter/receiver 302 and a counter interference-signal transmitter antenna port for a counter interference system 410 (e.g., a counter GPS interference system) where the exemplary first radio antenna 306 is configured to transmit or receive in a radio spectrum between 1 MHz and 6 GHz. An active positioning antenna (e.g., GPS antenna system) 305 is connected to a positioning system receiver antenna port of an active positioning system (e.g., a GPS system not shown). A second radio antenna 304 is connected to a 2.4 GHz transmitter receiver antenna port and is configured to support a wireless information network. A third radio antenna 303 is connected to a LFR antenna port and is configured to transmit or receive in a radio spectrum between 30 kHz and 300 kHz. A wideband ground communication antenna 301 is connected to the five-port 10/100/1000 Mb/sec switch and is configured to receive data feeds from airborne or space-based platforms. Note the active positioning system antenna 305 can be antenna-only system that connects with another position system element, e.g., GPS system that receives inputs from the antenna-only or a combined GPS and antenna system.

Figure 8:
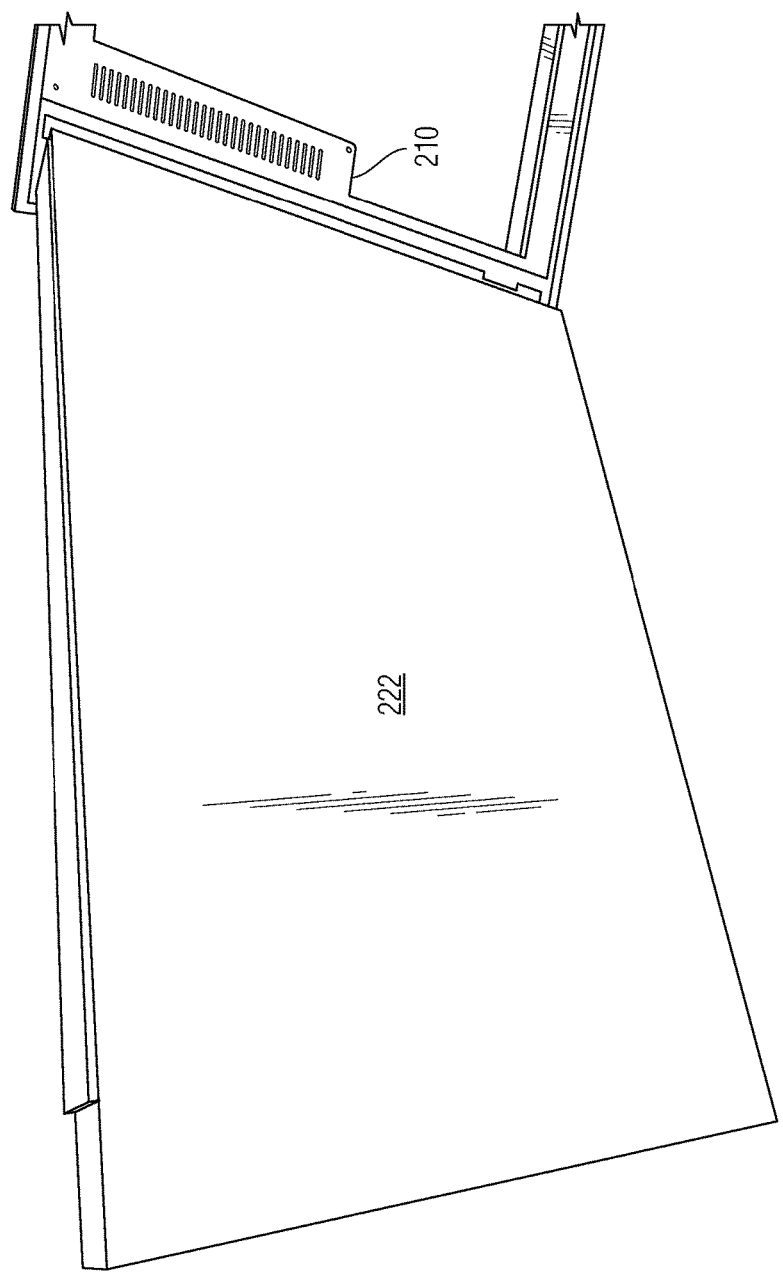
FIG. 8 shows a close up view of a first hinged monitor support plate.

FIG. 8 shows a rear view of the first hinged, monitor support plate 222. The second vertical side 210 is also shown.

FIG. 9 shows a rear view of the second hinged, monitor support plate 223. A plurality of the support fixtures 221 are coupled to an outer face of the second hinged, monitor support plate 223. The support fixtures 221 a placed at such a location as to allow the secure holding of the removable keyboard 205 (not shown) by capturing the plurality of locking pins 220 (as seen in FIG. 2).

FIG. 10 shows the second hinged, monitor support plate 223 in the second closed position wherein the removable keyboard 205 is securely held by the support fixtures 221.

FIG. 11 shows an exemplary pivot hinge. In particular, this drawing shows the fourth pivot hinge 227 coupling the second hinged monitor support plate 223 to an interior face of the horizontal bottom 206.

Figure 12:
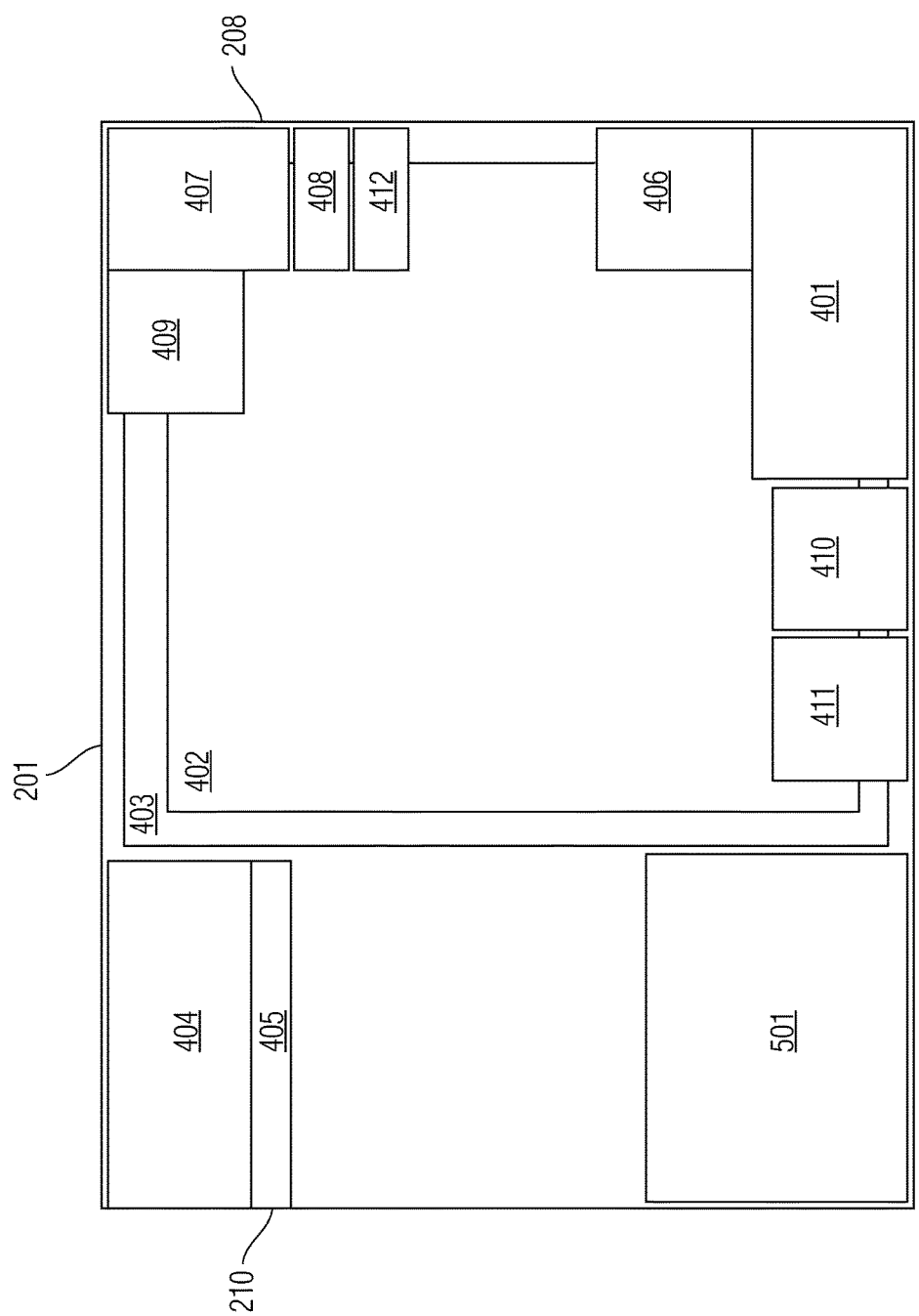
FIG. 12 shows a simplified disposition of internal components.

FIG. 12 shows a simplified exemplary diagram of an exemplary disposition of internal components of the person-portable command and control data center 101. A user configurable power supply 401 is coupled to an inner face of the case proximal to the vertical back (not shown) and configured to accept a variety of power inputs and convert the inputs into an output signal with a waveform of 110 v at 60 Hz and 15 amps. A workstation motherboard 402 is coupled to an inner face of the case. A server motherboard 403 disposed parallel to the workstation motherboard 402 at a location proximal to the vertical face (not shown). The position of the server motherboard 403 creates a separation of less than 1.8 inches between a face of the workstation motherboard 402 and a face of the server motherboard 403. A plurality of data storage devices 404 are secured within the case and connected to one or more the motherboards. The data storage devices 404 are coupled to a formed tray 405, disposed in proximity to the second vertical side 210, and secured by the quick release mechanisms 214 (as seen in FIG. 4) so as to allow rapid removal of the data storage devices. A radio transceiver 406 comprising an antenna port accessible through a selected aperture in the first vertical side 208, is coupled to an inner face of the case, and connected to the workstation motherboard 402. A five-port 10/100/1000 Mb/sec switch 407 comprising a plurality of ports accessible through a selected aperture 219 (as in FIG. 3) in the first vertical side 208 is coupled to an inner face of the case and connected to the server motherboard 403 and to the workstation motherboard 402. A fiber optic network card 408 comprising a plurality of ports accessible through a selected aperture 218 (as in FIG. 3) in the first vertical side 208 is coupled to an inner face of the case and connected to either of the motherboards. A positioning system receiver (e.g., GPS system) 409 comprising an antenna port accessible through a selected aperture in the first vertical side 208 is secured within the case and connected to the server motherboard 403. A counter interference-signal transmitter or jammer 410 comprising an antenna port accessible through a selected aperture in the first vertical side 408 is secured within the case and connected to the workstation motherboard 402. The counter interference-signal transmitter 410 is configured to produce a signal capable of defeating detected interference signals. A low frequency radio 411 comprising an antenna port accessible through a selected aperture in the first vertical side 408 is secured within the case and connected to the workstation motherboard 402. A 2.4 GHz transmitter receiver 412 comprising an antenna port accessible through a selected aperture in the first vertical side 208 is secured within the case and connected to the workstation motherboard 402.

Figure 13:
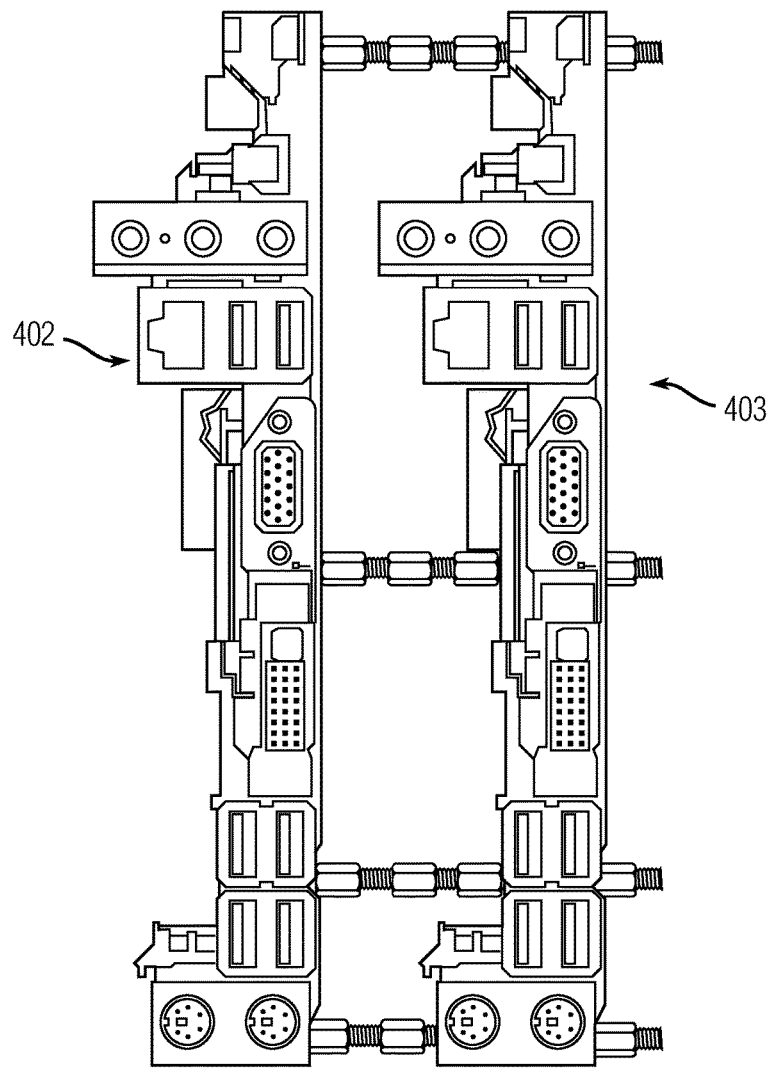
FIG. 13 shows the orientation of a workstation motherboard in close proximity to a server motherboard.

FIG. 13 shows an orientation of workstation motherboard 402 parallel to server motherboard 403. An exemplary separation between the two motherboards 402, 403 being less than 1.8 inches.

Figure 14:
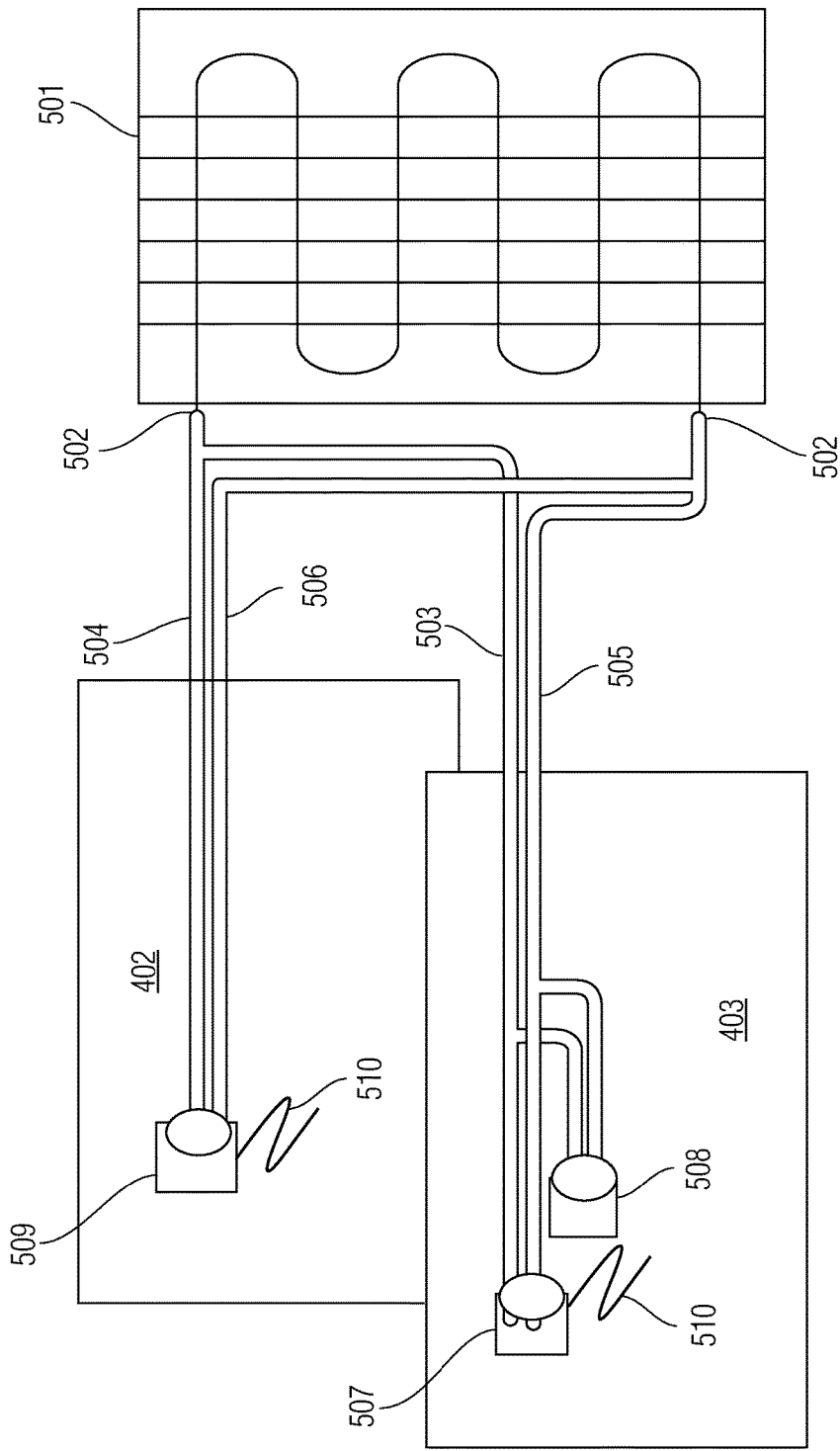
FIG. 14 shows a sealed, liquid cooling system diagram.

FIG. 14 shows an exemplary sealed, liquid cooling system diagram. The sealed liquid cooling system comprises a quantity of heat transfer fluid, a radiator 501 having a plurality of pipe coupling ports 502, a first fluid input pipe 503, a second fluid input pipe 504, a first fluid output pipe 505, a second fluid output pipe 506, a first heat sink and pump 507, a second heat sink and pump 508, a third heat sink and pump 509, and a plurality of wires 510 configured to transmit an activation signal from the motherboards. The fluid input pipes and the fluid output pipes are coupled to the radiator pipe coupling ports 502. The first heat sink and pump 507 is disposed in contact with a first central processing unit of the server motherboard, is coupled to the first fluid input pipe 504 and to the first fluid output pipe 505, and coupled to a portion of the wires 510. The second heat sink and pump 508 is disposed in contact with a second central processing unit of the server motherboard, is coupled to the first fluid input pipe 503 and to the first fluid output pipe 505, and coupled to a portion of the wires 510. The third heat sink and pump 509 is disposed in contact with the workstation central processing unit, is coupled to the second fluid input pipe 504 and to the second fluid output pipe 506, and coupled to a portion of the wires 510. The radiator 501 is disposed within three 5.25 inch drive bays proximal to the horizontal bottom and the second vertical side. The radiator 501 is contained entirely within the case. The sealed liquid cooling system is configured to allow a quantity of waste heat to pass from the central processing units to a portion of the heat transfer fluid, the portion of heat transfer fluid is transported within the fluid input pipes to the radiator 501. The radiator is configured to allow a quantity of waste heat to pass from the portion of heat transfer fluid to a portion of proximal ambient air, the portion of heat transfer fluid is transported within the fluid output pipes back to the heat sinks and pumps. The radiator 501 being further configured to passively power a convection current as the heated portion of proximal air rises within the case and exits the case through a plurality of first apertures and air paths and a portion of cooler ambient temperature air is drawn through a second plurality of apertures and air pathways in and from a lower portion of the second vertical side to facilitate a convection air current towards a low pressure area proximal to the radiator 501, the plurality of components contained within the case being positioned so as to facilitate the convection current by orienting, e.g., motherboards and other components, to facilitate convention of the air through the air pathways.

Figure 15:
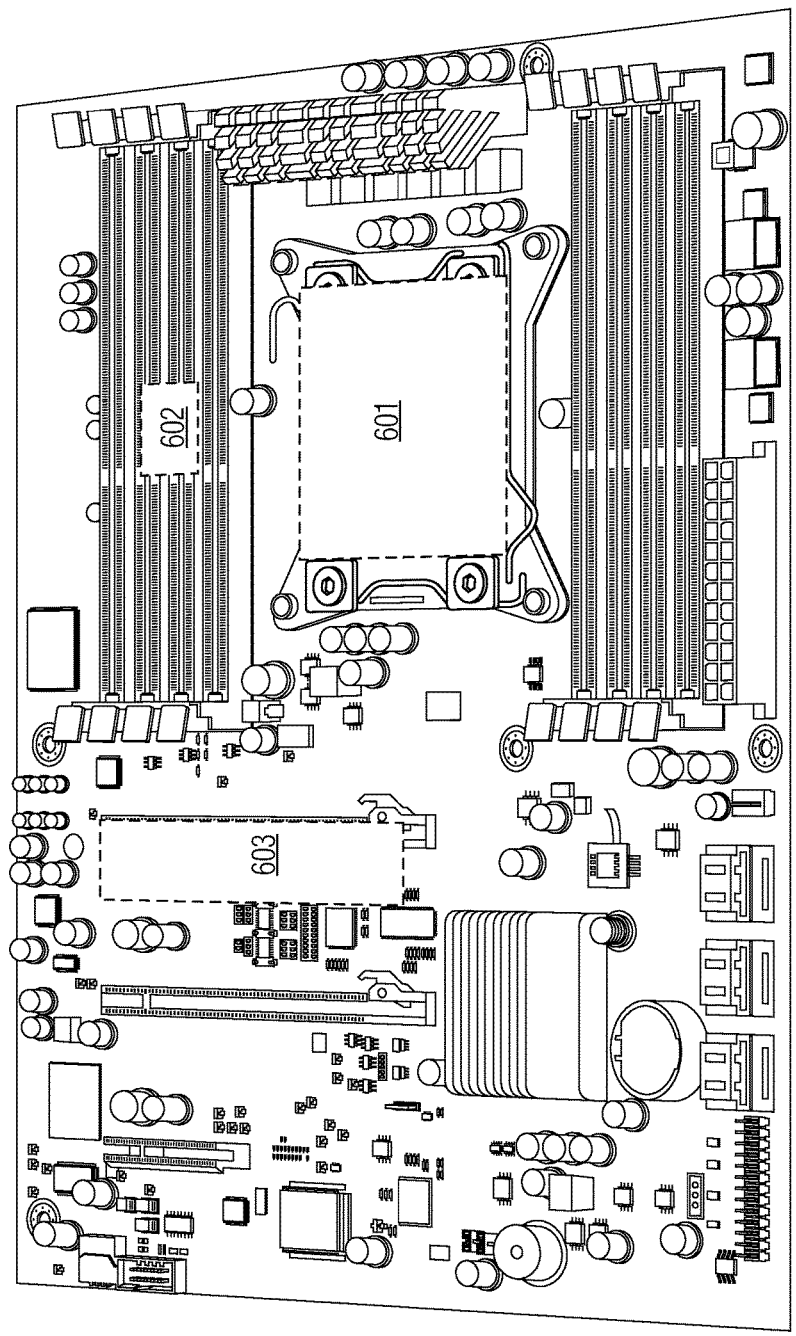
FIG. 15 shows an exemplary workstation motherboard.

FIG. 15 shows a simplified exemplary workstation motherboard comprising a workstation central processing unit 601, a plurality of random access memory chips 602, and a first 3D video card 603.

Figure 16:
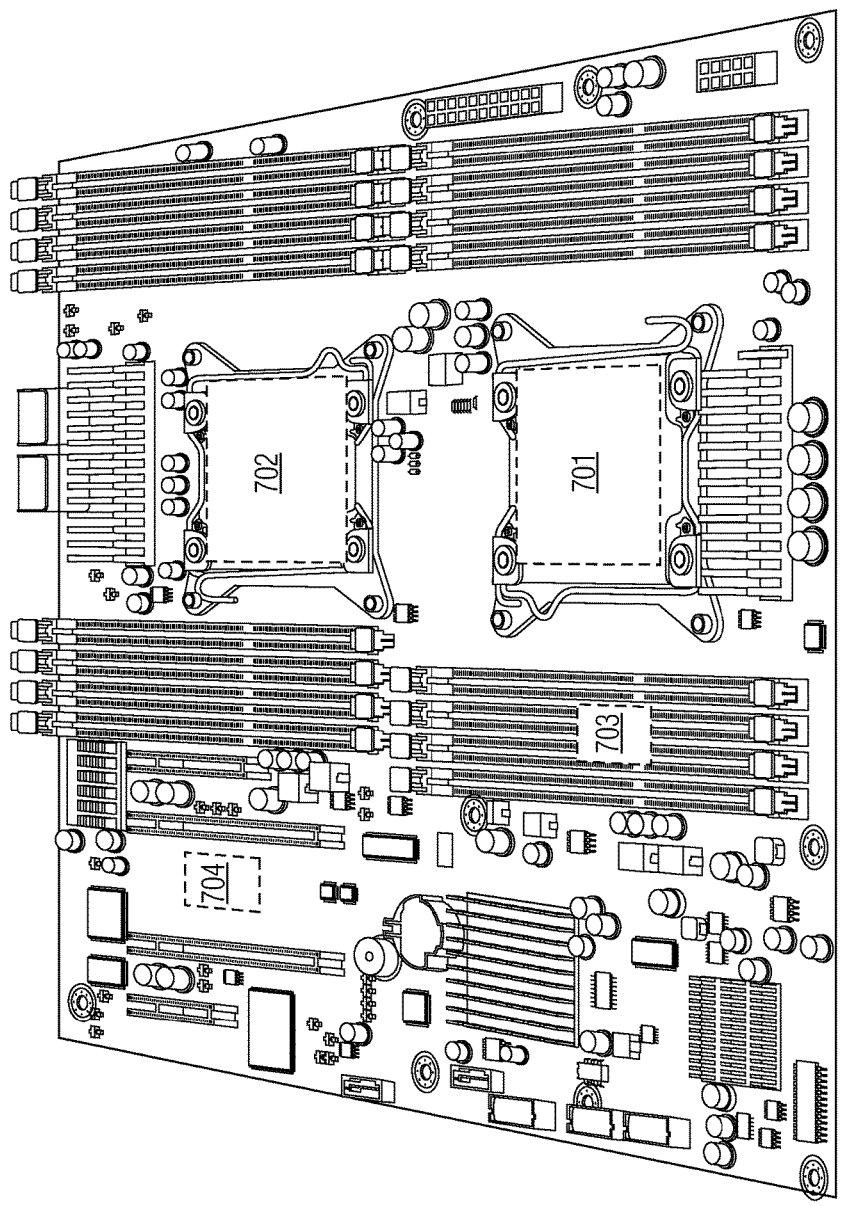
FIG. 16 shows an exemplary server motherboard.

FIG. 16 shows a simplified exemplary server motherboard, comprising a first central processing unit 701, a second central processing unit 702, a plurality of random access memory chips 703, and a second 3D video card 704 among other unnamed components generally used in such motherboards.

Figure 17:
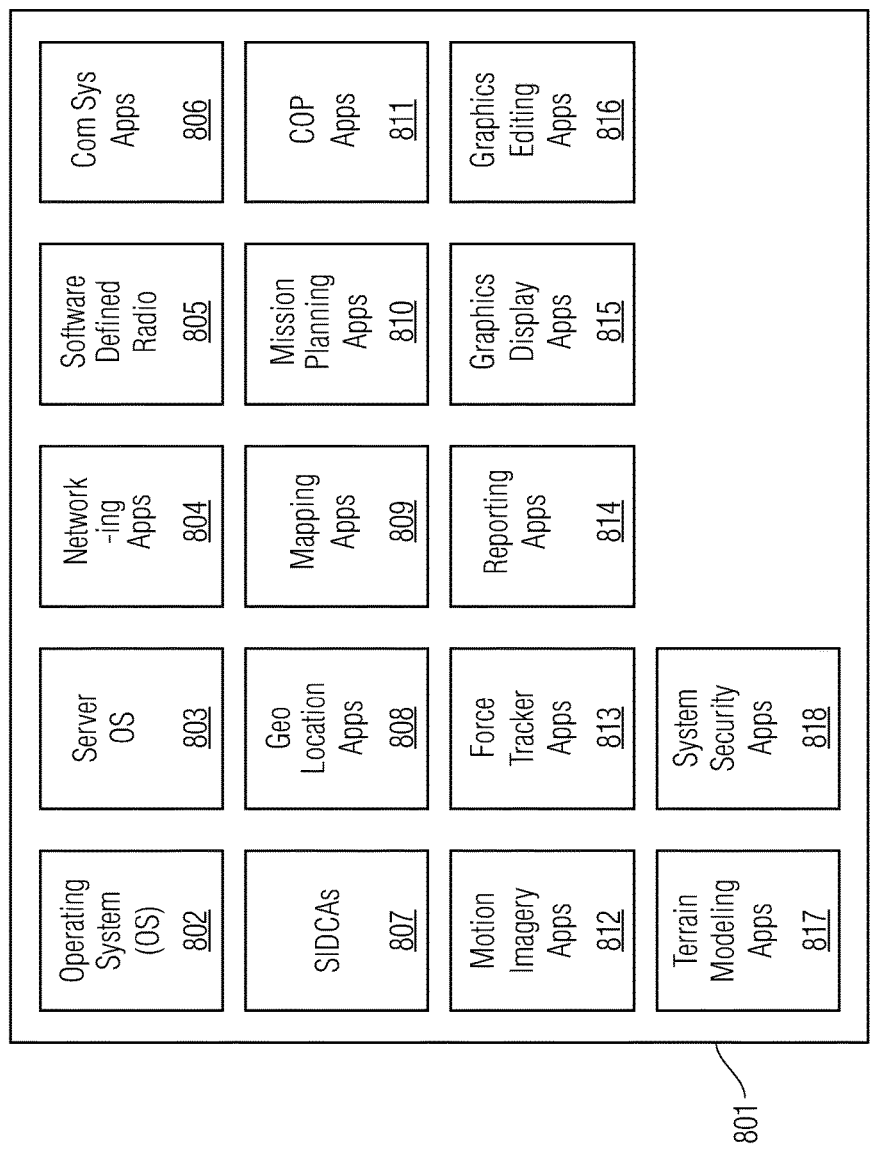
FIG. 17 shows a software suite optimized for command and control.

FIG. 17 shows a software suite optimized for command and control 801 comprising a workstation operating system 802, a server operating system 803, a plurality of networking applications 804, a software defined radio application 805 that operates the SDR transmitter/receiver 302, a plurality of communication applications 806, a signal interference detection and countering application (SIDCA) 807, a geo location application 808, a plurality of mapping applications 809, a mission planning application 810, a common operating picture application configured so as to identically display relevant information across a plurality of users 811, a plurality of motion imagery applications 812, a force tracker application 813, a plurality of reporting applications 814, a plurality of graphics display applications 815, a plurality of graphics editing applications 816, a terrain modeling application 817, and a plurality of system security applications 818.

Figure 18:
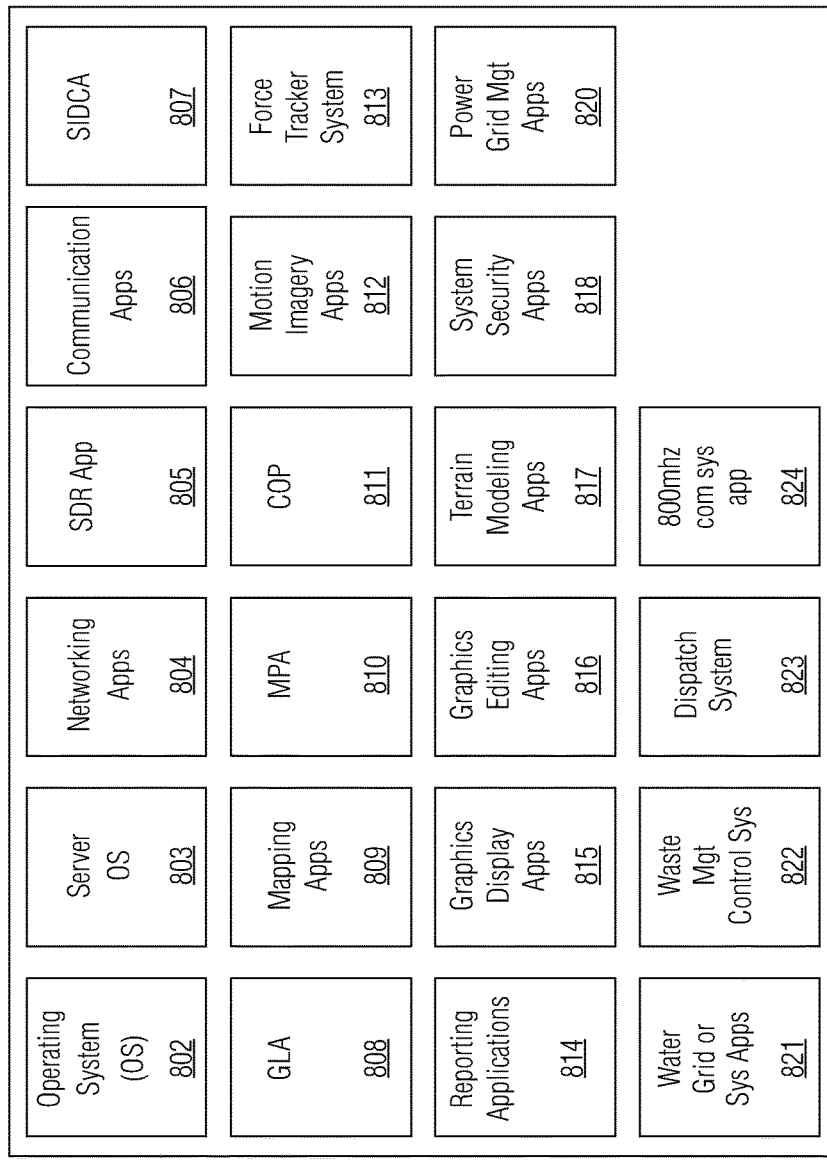
FIG. 18 shows a software suite optimized for incident response.

FIG. 18 shows a software suite optimized for incident response 819 comprising a workstation operating system 802, a server operating system 803, a plurality of networking applications 804, a software defined radio application 805, a plurality of communication applications 806, a signal interference detection and countering application (SIDCA) 807, a geo location application (GLA) 808, a plurality of mapping applications 809, a mission planning application (MPA) 810, a common operating picture (COP) e.g., RaptorX, application configured so as to identically display relevant information across a plurality of users 811, a plurality of motion imagery applications 812, a force tracker application 813, a plurality of reporting applications 814, a plurality of graphics display applications 815, a plurality of graphics editing applications 816, a terrain modeling application 817, and a plurality of system security applications 818, a power grid management application 820 configured so as to monitor and control energy distribution through an electrical power grid, a water grid management application 821 configured so as to monitor and control an existing water supply, a waste management application 822 configured so as to monitor, manage, and control waste and sewage systems, an E911 computer aided dispatch system application 823, an 800 MhZ communication network application 824.

Figure 19:
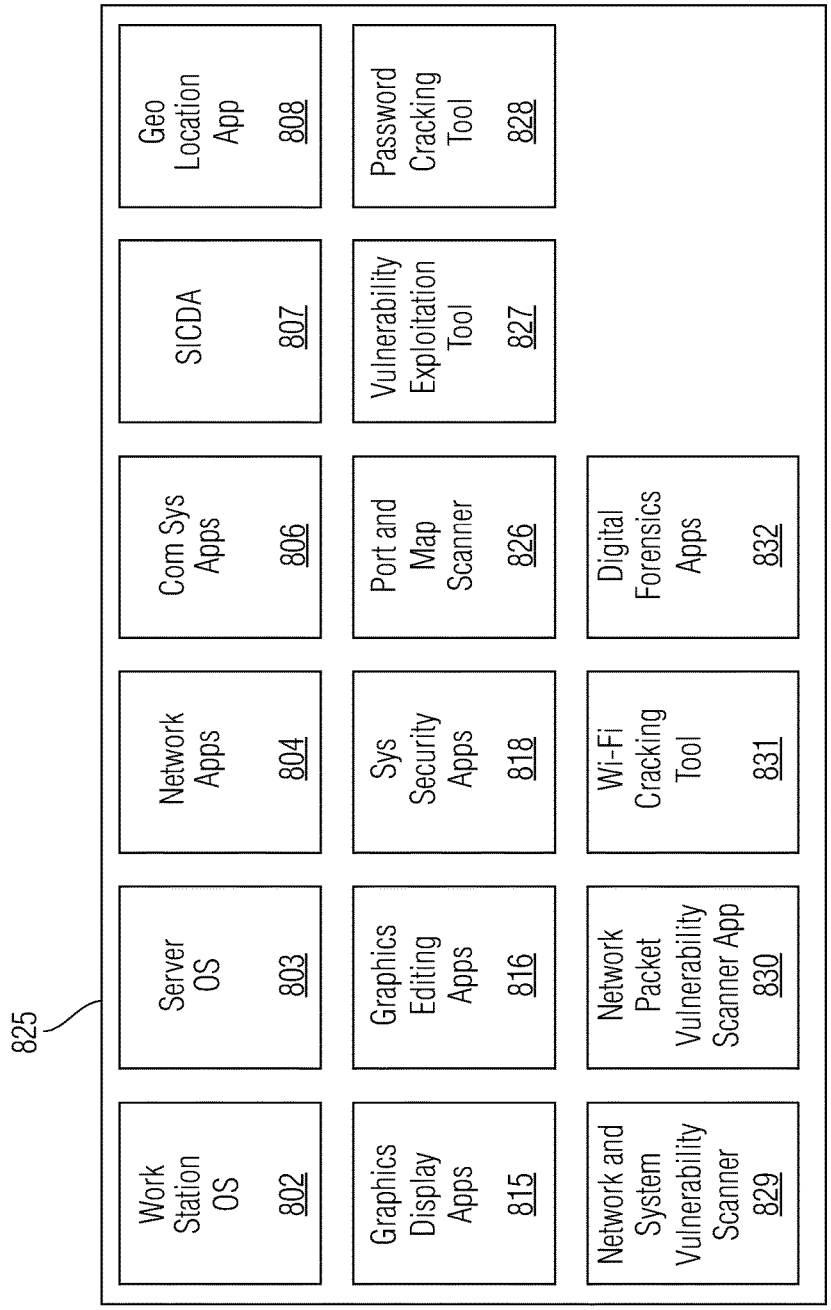
FIG. 19 shows a software suite optimized for network penetration testing.

FIG. 19 shows a software suite optimized for network penetration testing 825 comprising a workstation operating system 802, a server operating system 803, a plurality of networking applications 804, a plurality of communication applications 806, a signal interference detection and countering application (SIDCA) 807, a geo location application 808, a plurality of graphics display applications 815, a plurality of graphics editing applications 816, a plurality of system security applications 818, a port and map scanner application 826 configured so as to enable network discovery and security auditing, a vulnerability exploitation tool 827 configured so as to provide a user with information regarding known security vulnerabilities, a password cracking tool 828, a web vulnerability scanner application 829, a network packet vulnerability scanner application 830 configured so as to capture data packets in a network in real time and display the data packets in human-readable format, a Wi-Fi cracking tool 831 configured so as to defeat Wi-Fi security settings, a digital forensics application 832 configured so as to produce an overall cyber threat picture.

Figure 20:
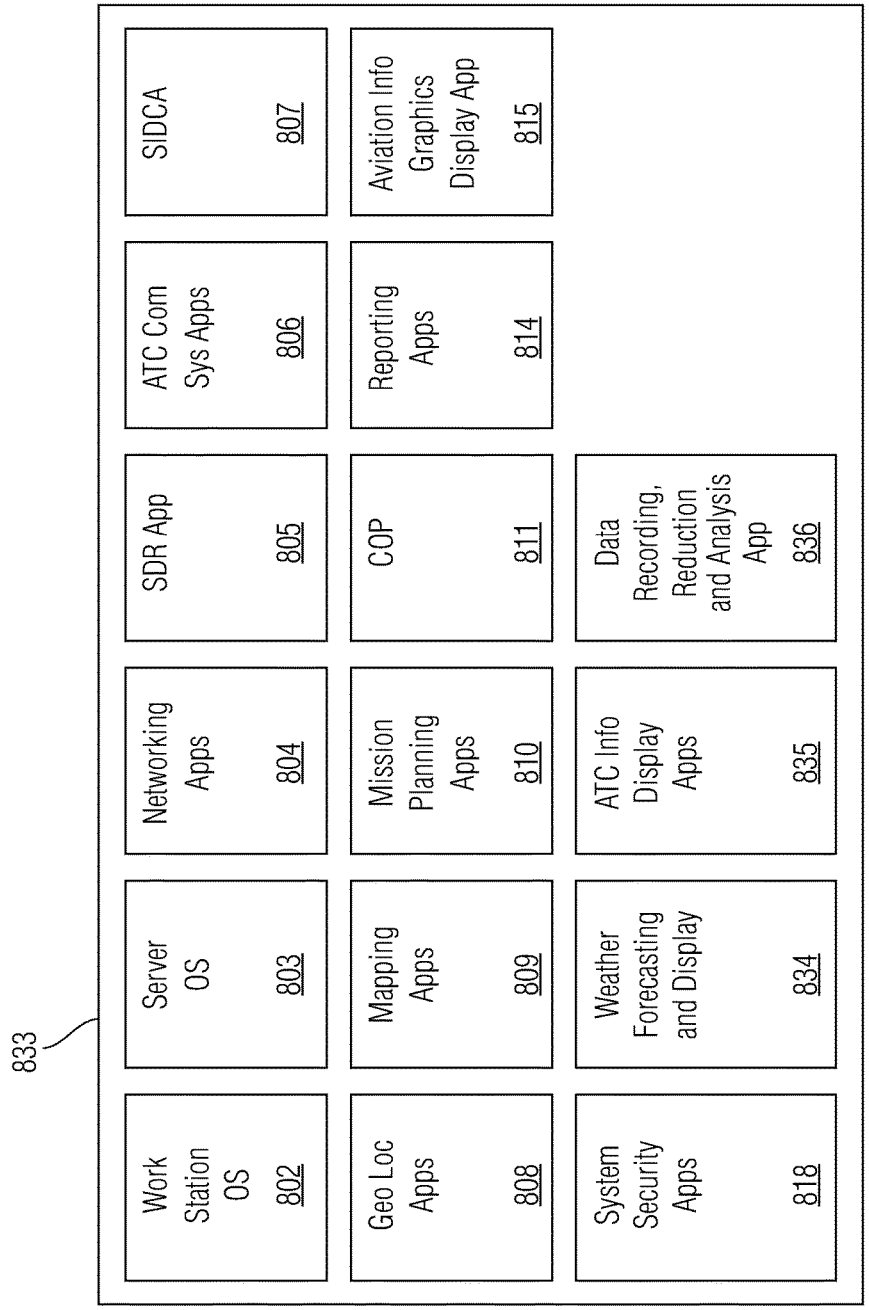
FIG. 20 shows a software suite optimized for air traffic control.

FIG. 20 shows a software suite optimized for air traffic control 833 comprising a workstation operating system 802, a server operating system 803, a plurality of networking applications 804, a SDR application 805, a plurality of communication applications 806 configured so as to send data to and receive data from surrounding centers, TRACONs, towers, and aircraft, a signal interference detection and countering application (SIDCA) 807, a geo location application 808, a plurality of mapping applications 809, a mission planning application 810 (e.g., Army Aviation Mission Planning System (AMPS) or a more general planning system, etc used to create a plan of action such as a step by step process to execute a mission or activity with some embodiments including a simulation system), a common operating picture (COP) application 811 configured so as to identically display relevant information across a plurality of users, a plurality of reporting applications 814 (e.g., a system that is used for monitoring a mission or activity schedule of events and plan events/resources used, etc along with a status of plan or completion reporting capability), a plurality of graphics display applications 815 configured so as to display airspace boundaries, arrival and departure routes, track data and current aircraft positions, flight plans, aircraft ID, reported altitude, assigned altitude, ground speed, metering, arrival, and departure lists, weather information, and electronic flight strips, a weather forecasting and display application 834, a plurality of system security applications 818, an air traffic control application 835 configured so as to provide track prediction, conflict probe and alert functionality, resolution advisories, minimum safe altitude advisory warnings, and time-based arrival and departure metering, a data recording, reduction and analysis application 836 configured so as to record and facilitate analysis of any and all aircraft flight, track, display, and controller input, internal process functionality, inter-process communication, inter-center and inter-TRACON communications.

Figure 21:
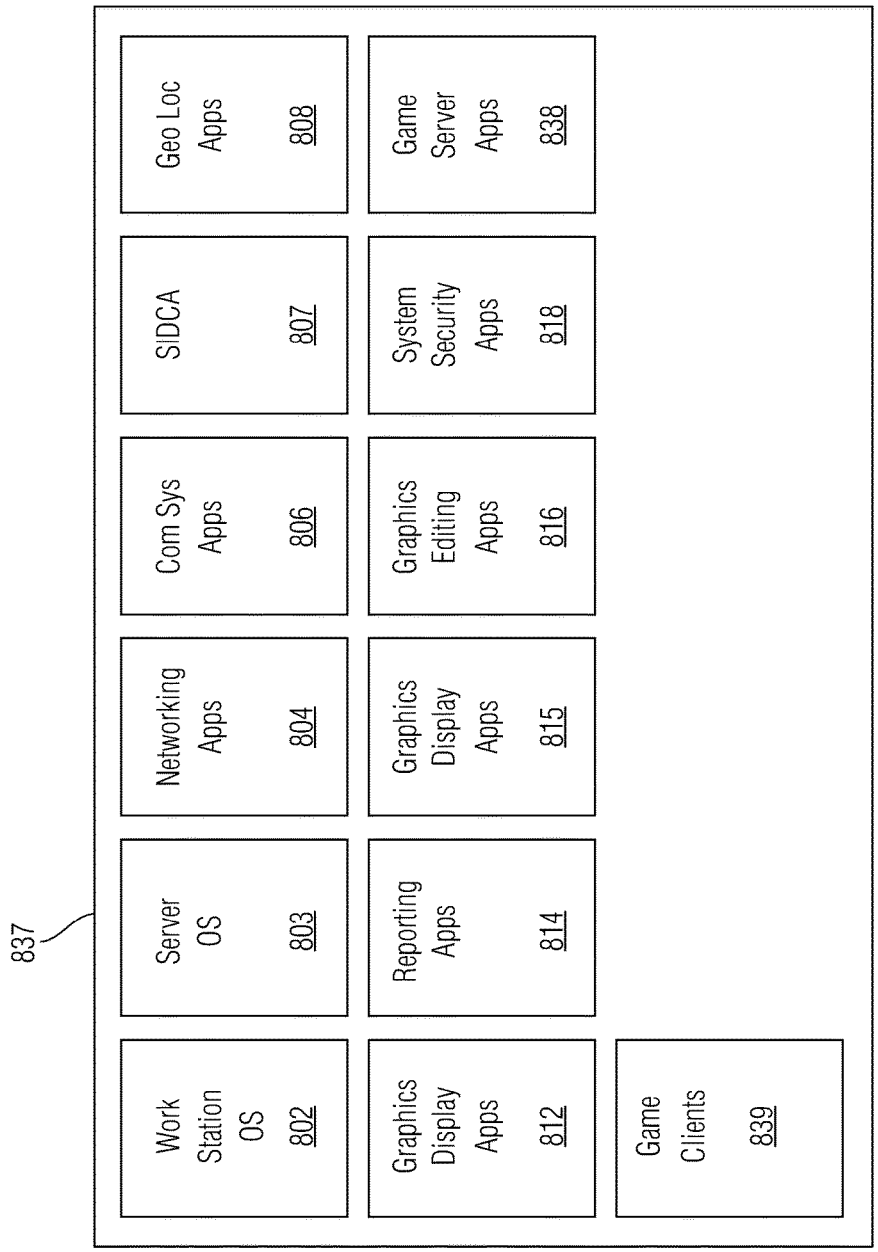
FIG. 21 shows a software suite optimized for a temporary gaming network.

FIG. 21 shows a software suite optimized for a temporary gaming network 837 comprising a workstation operating system 802, a server operating system 803, a plurality of networking applications 804, a plurality of communication applications 806, a signal interference detection and countering application (SIDCA) 807, a geo location application 808, a plurality of motion imagery applications 812, a plurality of reporting applications 814 (see above for examples), a plurality of graphics display applications 815, a plurality of graphics editing applications 816, a plurality of system security applications 818, a game server application 838, a plurality of game clients 839.

Figure 22A:
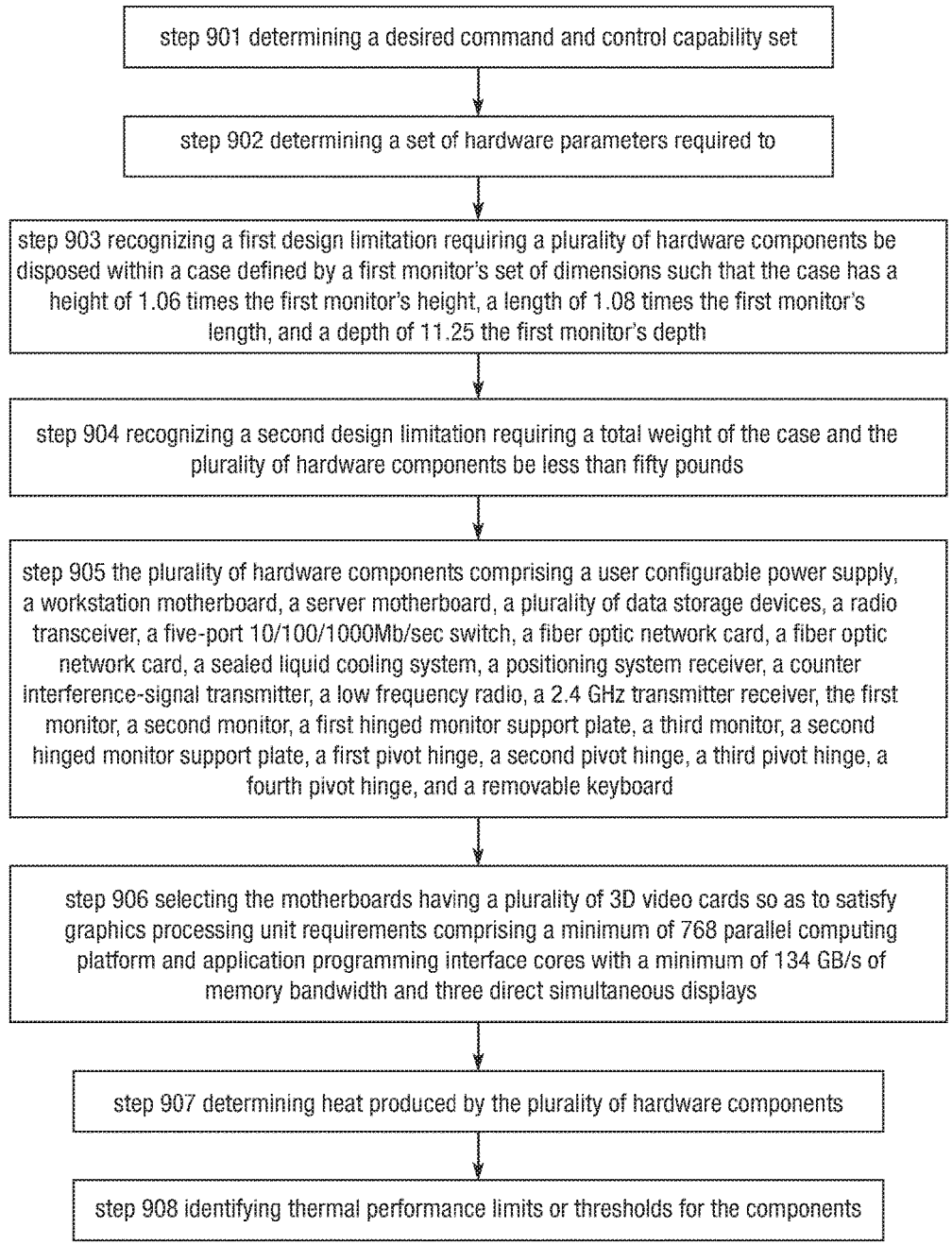

FIG. 22A shows a method for designing a person-portable command and control data center 101; step 901: determining a desired command and control capability set; at step 902: determining a set of hardware parameters required to provide the desired command and control capability set; step 903: recognizing a first design limitation requiring a plurality of hardware components be disposed within a case defined by a first monitor's set of dimensions such that the case has a height of 1.06 times the first monitor's height, a length of 1.08 times the first monitor's length, and a depth of 11.25 the first monitor's depth; step 904: recognizing a second design limitation requiring a total weight of the case and the plurality of hardware components be less than fifty pounds; step 905 the plurality of hardware components comprising a user configurable power supply, a workstation motherboard, a server motherboard, a plurality of data storage devices, a radio transceiver, a five-port 10/100/1000 Mb/sec switch, a fiber optic network card, a sealed liquid cooling system, a positioning system receiver, a counter interference-signal transmitter, a low frequency radio, a 2.4 GHz transmitter receiver, the first monitor, a second monitor, a first hinged monitor support plate, a third monitor, a second hinged monitor support plate, a first pivot hinge, a second pivot hinge, a third pivot hinge, a fourth pivot hinge, and a removable keyboard; step 906 selecting the motherboards having a plurality of 3D video cards so as to satisfy graphics processing unit requirements comprising a minimum of 768 parallel computing platform and application programming interface cores with a minimum of 134 GB/s of memory bandwidth and three direct simultaneous displays; step 907: determining heat produced by the plurality of hardware components; step 908: identifying thermal performance limits or thresholds for the components.

Figure 22B:
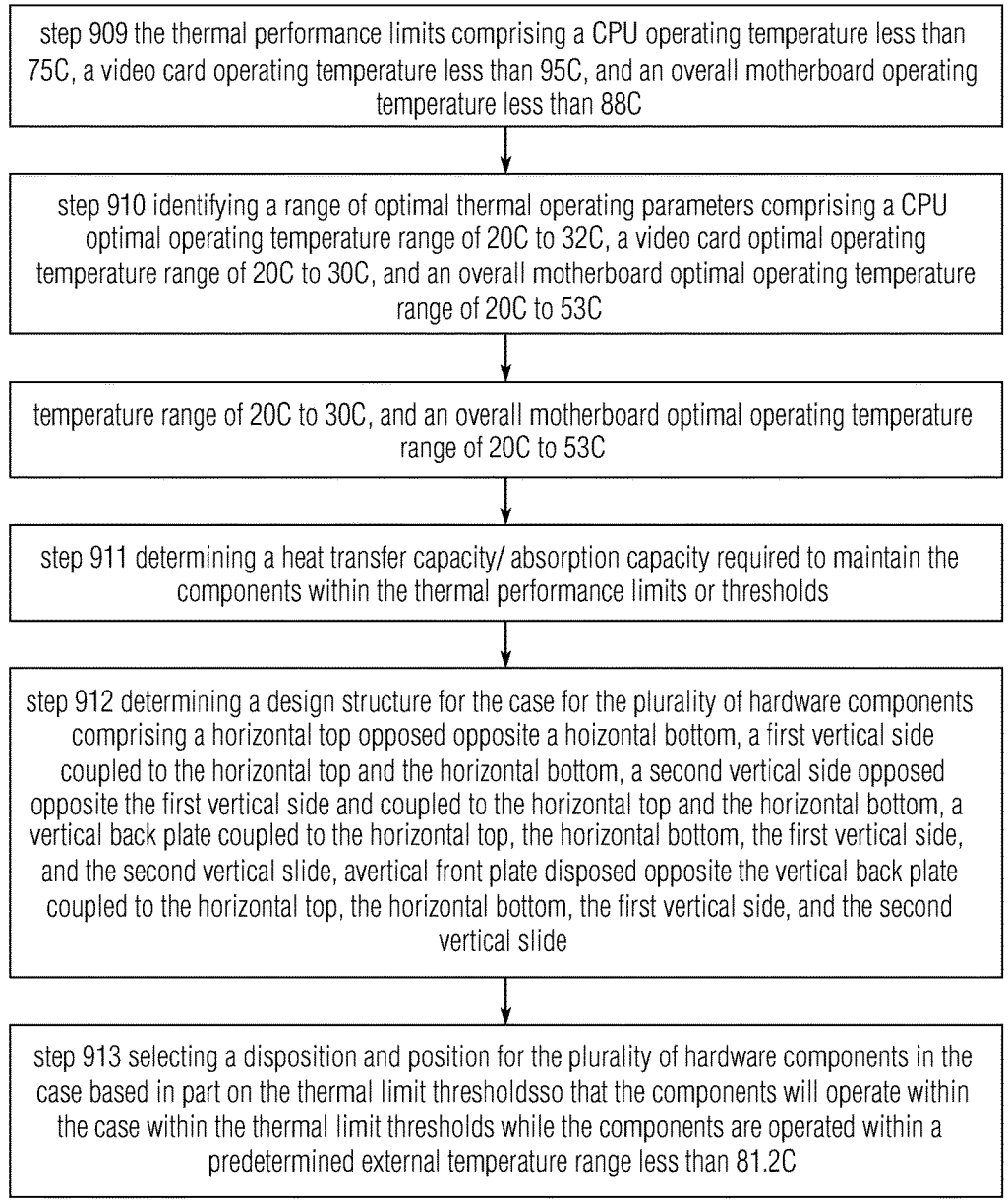

FIG. 22B shows a continuation of a method for designing a person-portable command and control data center 101; step 909: the thermal performance limits comprising a CPU operating temperature less than 75 C, a video card operating temperature less than 95 C, and an overall motherboard operating temperature less than 88 C; step 910: identifying a range of optimal thermal operating parameters comprising a CPU optimal operating temperature range of 20 C to 32 C, a video card optimal operating temperature range of 20 C to 30 C, and an overall motherboard optimal operating temperature range of 20 C to 53 C; step 911: determining a heat transfer capacity/absorption capacity required to maintain the components within the thermal performance limits or thresholds; step 912: determining a design structure for the case for the plurality of hardware components comprising a horizontal top opposed opposite a horizontal bottom, a first vertical side coupled to the horizontal top and the horizontal bottom, a second vertical side opposed opposite the first vertical side and coupled to the horizontal top and the horizontal bottom, a vertical back plate coupled to the horizontal top, the horizontal bottom, the first vertical side, and the second vertical slide, a vertical front plate disposed opposite the vertical back plate coupled to the horizontal top, the horizontal bottom, the first vertical side, and the second vertical slide; step 913: selecting a disposition and position for the plurality of hardware components in the case based in part on the thermal limit thresholds so that the components will operate within the case within the thermal limit thresholds while the components are operated within a predetermined external temperature range less than 81.2 C.

FIG. 22C shows a continuation of a method for designing a person-portable command and control data center 101; step 914: determining a design structure for a sealed liquid cooling system that can be operated to maintain components within predetermined thermal limits in air with an ambient temperature less than 81.2 C, comprising a quantity of heat transfer fluid, a radiator having a plurality of pipe coupling ports, a first fluid input pipe, a second fluid input pipe, a first fluid output pipe, a second fluid output pipe, a first heat sink and pump, a second heat sink and pump, a third heat sink and pump, and a plurality of wires configured to transmit an activation signal from the motherboards; wherein the fluid input pipes and the fluid output pipes are coupled to the radiator pipe coupling ports, the first heat sink and pump is disposed in contact with the first central processing unit, the second heat sink and pump is disposed in contact with the second central processing unit, the first and second heat sink and pumps are coupled to the first fluid input pipe, to the first fluid output pipe, and to a portion of the wires, the third heat sink and pump is disposed in contact with the workstation central processing unit; the third heat sink and pump is coupled to the second fluid input pipe, to the second fluid output pipe, and to a portion of the wires; step 915: optimizing the liquid cooling system so as to allow a quantity of waste heat to pass from the central processing units to a portion of the heat transfer fluid, the portion of heat transfer fluid to be transported within the fluid input pipes to the radiator, the radiator being configured to allow a quantity of waste heat to pass from the portion of heat transfer fluid to a portion of proximal ambient air, the portion of heat transfer fluid to be transported within the fluid output pipes to the heat sinks and pumps; step 916: selecting a disposition location within the case for the radiator so as to enable the radiator to passively power a convection current as the heated portion of proximal air rises within the case and exits the case through a plurality of first apertures and air pathways and a portion of cooler ambient temperature air is drawn through a plurality of second apertures and air pathways in a lower portion of the second vertical side to facilitate convection air current flow created by a resultant low pressure area proximal to the radiator; step 917: selecting a software suite optimized for the desired command and control capability set.

Figure 23A:
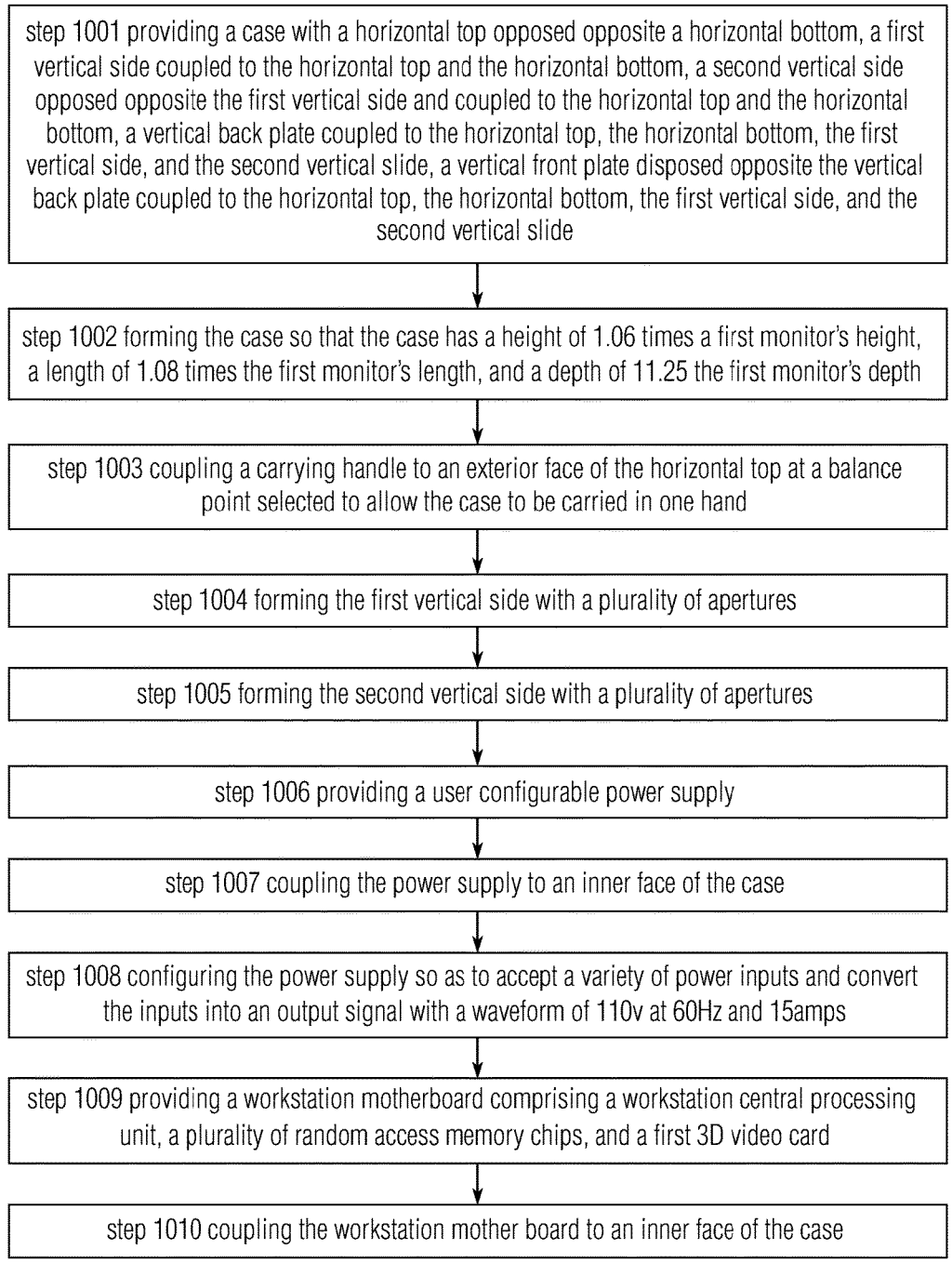
FIGS. 23A, 23B, 23C, 23D, 23E and 23F show an exemplary method for assembling a one-person-portable command and control data center.

FIG. 23A shows a method for assembling a one-person-portable command and control data center 101 comprising the steps of: step 1001 providing a case with a horizontal top opposed opposite a horizontal bottom, a first vertical side coupled to the horizontal top and the horizontal bottom, a second vertical side opposed opposite the first vertical side and coupled to the horizontal top and the horizontal bottom, a vertical back plate coupled to the horizontal top, the horizontal bottom, the first vertical side, and the second vertical slide, a vertical front plate disposed opposite the vertical back plate coupled to the horizontal top, the horizontal bottom, the first vertical side, and the second vertical slide; step 1002: forming the case so that the case has a height of 1.06 times a first monitor's height, a length of 1.08 times the first monitor's length, and a depth of 11.25 the first monitor's depth; step 1003: coupling a carrying handle to an exterior face of the horizontal top at a balance point selected to allow the case to be carried in one hand; step 1004: forming the first vertical side with a plurality of apertures; step 1005: forming the second vertical side with a plurality of apertures; step 1006: providing a user configurable power supply; step 1007: coupling the power supply to an inner face of the case; step 1008: configuring the power supply so as to accept a variety of power inputs and convert the inputs into an output signal with a waveform of 110 v at 60 Hz and 15 amps; step 1009: providing a workstation motherboard comprising a workstation central processing unit, a plurality of random access memory chips, and a first 3D video card; step 1010: coupling the workstation motherboard to an inner face of the case.

Figure 23B:
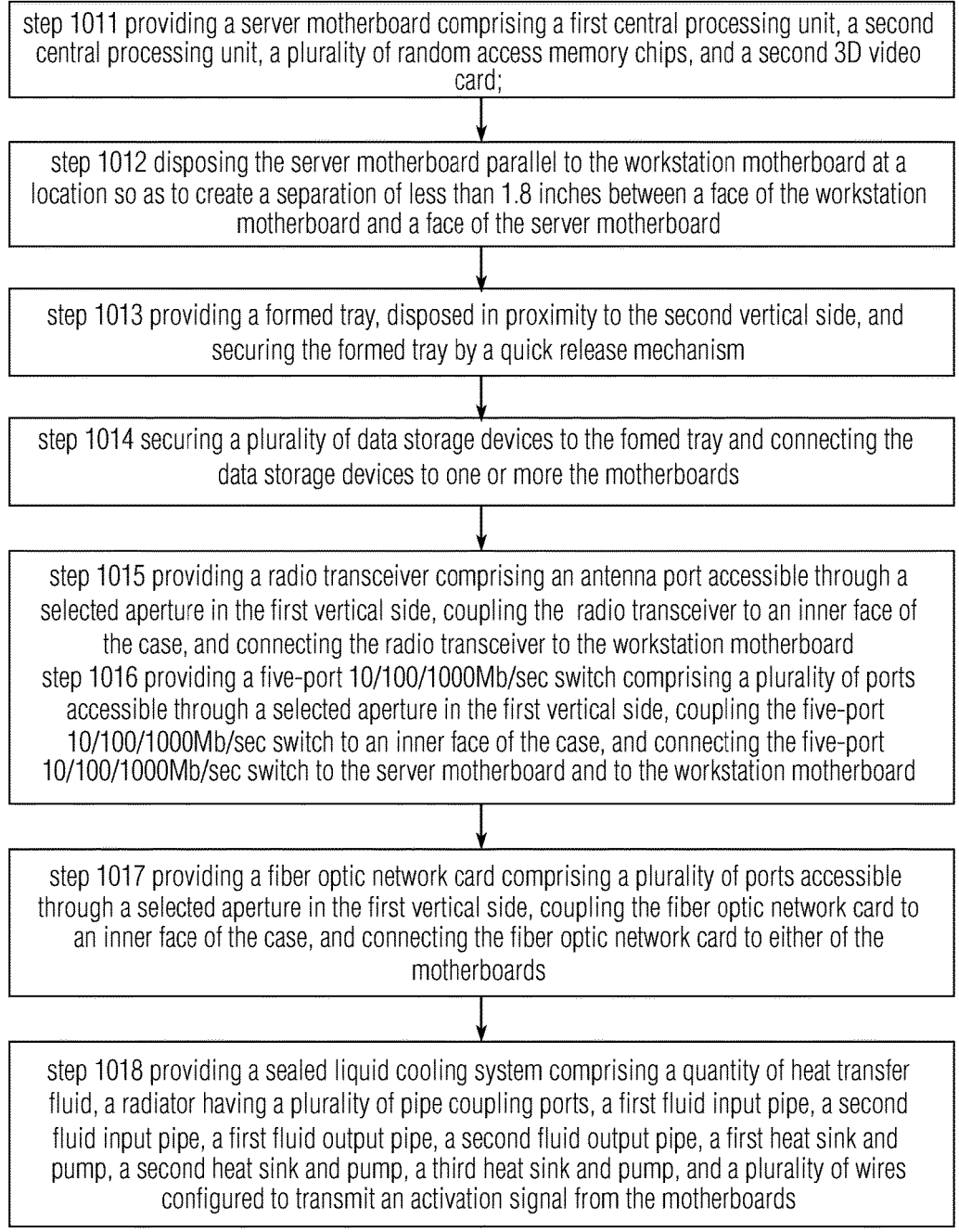

FIG. 23B shows a continuation of a method for assembling a one-person-portable command and control data center 101 comprising the steps of: step 1011: providing a server motherboard comprising a first central processing unit, a second central processing unit, a plurality of random access memory chips, and a second 3D video card; step 1012: disposing the server motherboard parallel to the workstation motherboard at a location so as to create a separation of less than 1.8 inches between a face of the workstation motherboard and a face of the server motherboard; step 1013: providing a formed tray, disposed in proximity to the second vertical side, and securing the formed tray by a quick release mechanism; step 1014: securing a plurality of data storage devices to the formed tray and connecting the data storage devices to one or more the motherboards; step 1015: providing a radio transceiver comprising an antenna port accessible through a selected aperture in the first vertical side, coupling the radio transceiver to an inner face of the case, and connecting the radio transceiver to the workstation motherboard; step 1016: providing a five-port 10/100/1000 Mb/sec switch comprising a plurality of ports accessible through a selected aperture in the first vertical side, coupling the five-port 10/100/1000 Mb/sec switch to an inner face of the case, and connecting the five-port 10/100/1000 Mb/sec switch to the server motherboard and to the workstation motherboard; step 1017: providing a fiber optic network card comprising a plurality of ports accessible through a selected aperture in the first vertical side, coupling the fiber optic network card to an inner face of the case, and connecting the fiber optic network card to either of the motherboards; step 1018: providing a sealed liquid cooling system comprising a quantity of heat transfer fluid, a radiator having a plurality of pipe coupling ports, a first fluid input pipe, a second fluid input pipe, a first fluid output pipe, a second fluid output pipe, a first heat sink and pump, a second heat sink and pump, a third heat sink and pump, and a plurality of wires configured to transmit an activation signal from the motherboards.

Figure 23C:
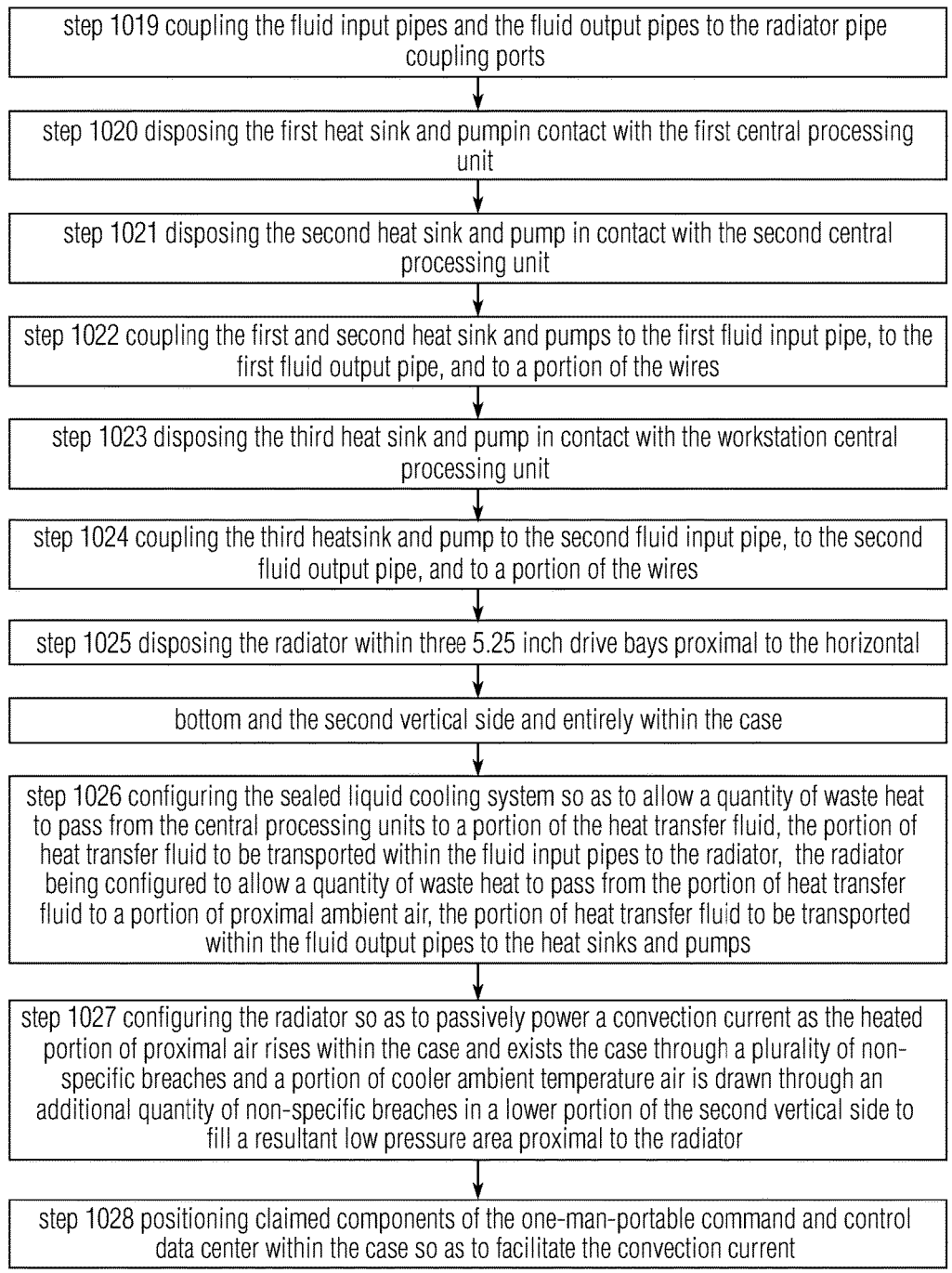

FIG. 23C shows a continuation of a method for assembling a one-person-portable command and control data center 101 comprising the steps of: step 1019: coupling the fluid input pipes and the fluid output pipes to the radiator pipe coupling ports; step 1020: disposing the first heat sink and pump in contact with the first central processing unit; step 1021: disposing the second heat sink and pump in contact with the second central processing unit; step 1022: coupling the first and second heat sink and pumps to the first fluid input pipe, to the first fluid output pipe, and to a portion of the wires; step 1023: disposing the third heat sink and pump in contact with the workstation central processing unit; step 1024: coupling the third heat sink and pump to the second fluid input pipe, to the second fluid output pipe, and to a portion of the wires; step 1025: disposing the radiator within three 5.25 inch drive bays proximal to the horizontal bottom and the second vertical side and entirely within the case; step 1026: configuring the sealed liquid cooling system so as to allow a quantity of waste heat to pass from the central processing units to a portion of the heat transfer fluid, the portion of heat transfer fluid to be transported within the fluid input pipes to the radiator, the radiator being configured to allow a quantity of waste heat to pass from the portion of heat transfer fluid to a portion of proximal ambient air, the portion of heat transfer fluid to be transported within the fluid output pipes to the heat sinks and pumps; step 1027: configuring the radiator so as to passively power a convection current as the heated portion of proximal air rises within the case and exits the case through a plurality of first apertures and air pathways and a portion of cooler ambient temperature air is drawn through a plurality of second apertures and air pathways in and from a lower portion of the second vertical side to facilitate a convection airflow from a resultant low pressure area proximal to the radiator; step 1028: positioning claimed components of the one-personportable command and control data center 101 within the case so as to facilitate the convection current.

Figure 23D:
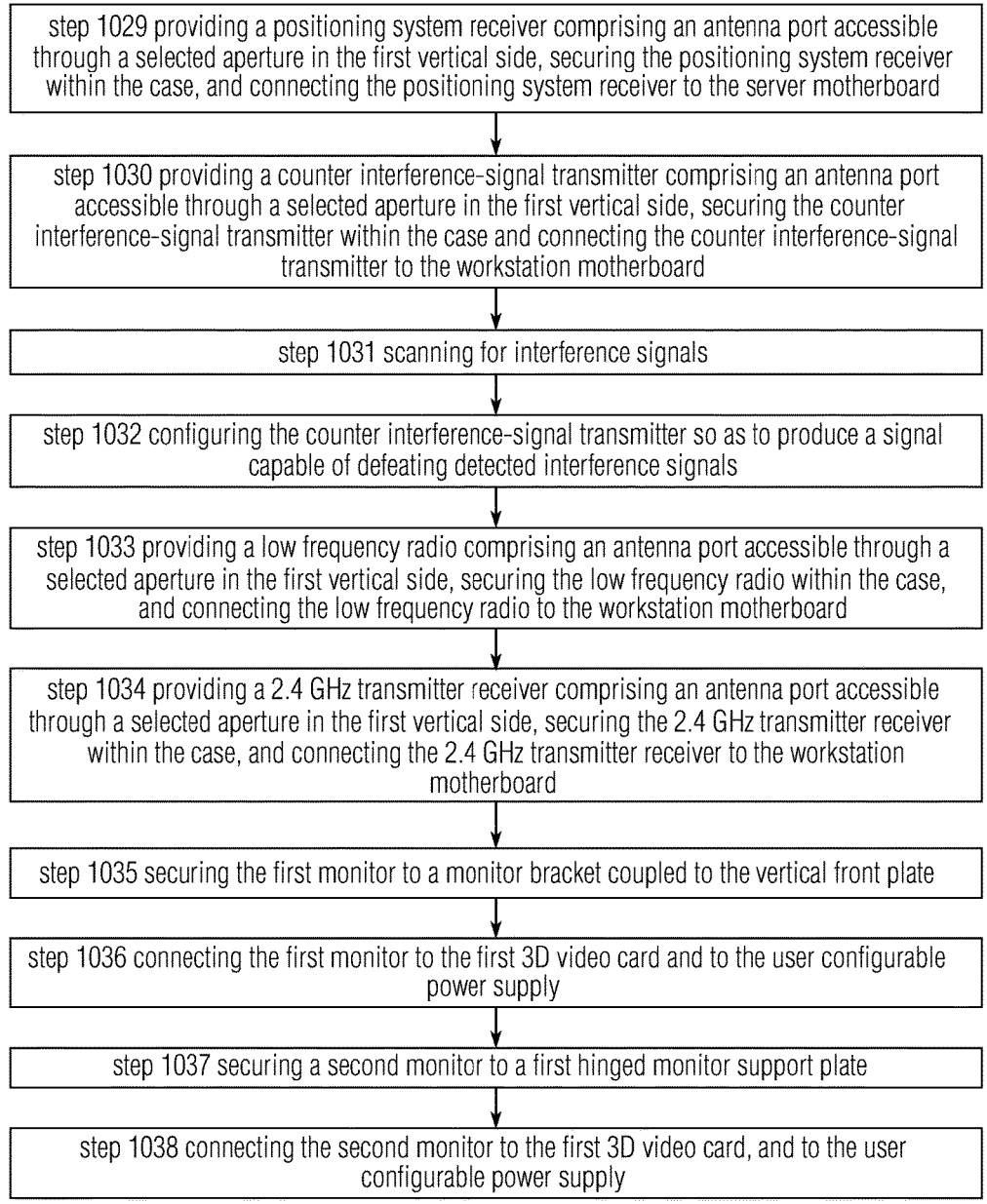

FIG. 23D shows a continuation of a method for assembling a one-person-portable command and control data center 101 comprising the steps of: step 1029: providing a positioning system receiver comprising an antenna port accessible through a selected aperture in the first vertical side, securing the positioning system receiver within the case, and connecting the positioning system receiver to the server motherboard; step 1030: providing a counter interference-signal transmitter comprising an antenna port accessible through a selected aperture in the first vertical side, securing the counter interference-signal transmitter within the case and connecting the counter interference-signal transmitter to the workstation motherboard; step 1031: scanning for interference signals; step 1032: configuring the counter interference-signal transmitter so as to produce a signal capable of defeating detected interference signals; step 1033: providing a low frequency radio comprising an antenna port accessible through a selected aperture in the first vertical side, securing the low frequency radio within the case, and connecting the low frequency radio to the workstation motherboard; step 1034: providing a 2.4 GHz transmitter receiver comprising an antenna port accessible through a selected aperture in the first vertical side, securing the 2.4 GHz transmitter receiver within the case, and connecting the 2.4 GHz transmitter receiver to the workstation motherboard; step 1035: securing the first monitor to a monitor bracket coupled to the vertical front plate; step 1036: connecting the first monitor to the first 3D video card and to the user configurable power supply; step 1037: securing a second monitor to a first hinged monitor support plate; step 1038: connecting the second monitor to the first 3D video card, and to the user configurable power supply.

Figure 23E:
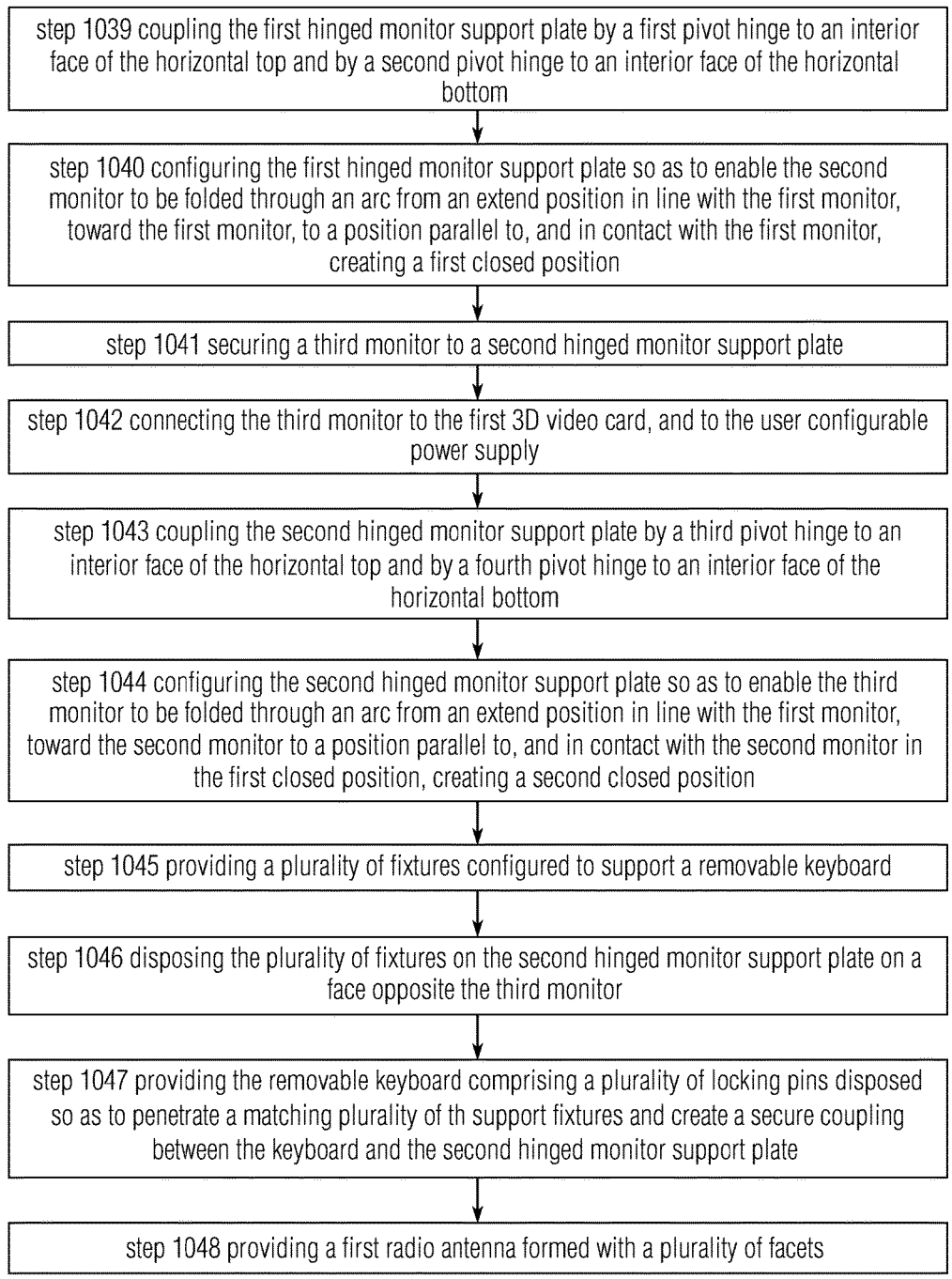

FIG. 23E shows a continuation of a method for assembling a one-person-portable command and control data center 101 comprising the steps of: step 1039: coupling the first hinged monitor support plate by a first pivot hinge to an interior face of the horizontal top and by a second pivot hinge to an interior face of the horizontal bottom; step 1040: configuring the first hinged monitor support plate so as to enable the second monitor to be folded through an arc from an extend position in line with the first monitor, toward the first monitor, to a position parallel to, and in contact with the first monitor, creating a first closed position; step 1041: securing a third monitor to a second hinged monitor support plate; step 1042: connecting the third monitor to the first 3D video card, and to the user configurable power supply; step 1043: coupling the second hinged monitor support plate by a third pivot hinge to an interior face of the horizontal top and by a fourth pivot hinge to an interior face of the horizontal bottom; step 1044: configuring the second hinged monitor support plate so as to enable the third monitor to be folded through an arc from an extend position in line with the first monitor, toward the second monitor to a position parallel to, and in contact with the second monitor in the first closed position, creating a second closed position; step 1045: providing a plurality of fixtures configured to support a removable keyboard; step 1046: disposing the plurality of fixtures on the second hinged monitor support plate on a face opposite the third monitor; step 1047: providing the removable keyboard comprising a plurality of locking pins disposed so as to penetrate a matching plurality of the support fixtures and create a secure coupling between the keyboard and the second hinged monitor support plate; step 1048: providing a first radio antenna formed with a plurality of facets.

Figure 23F:
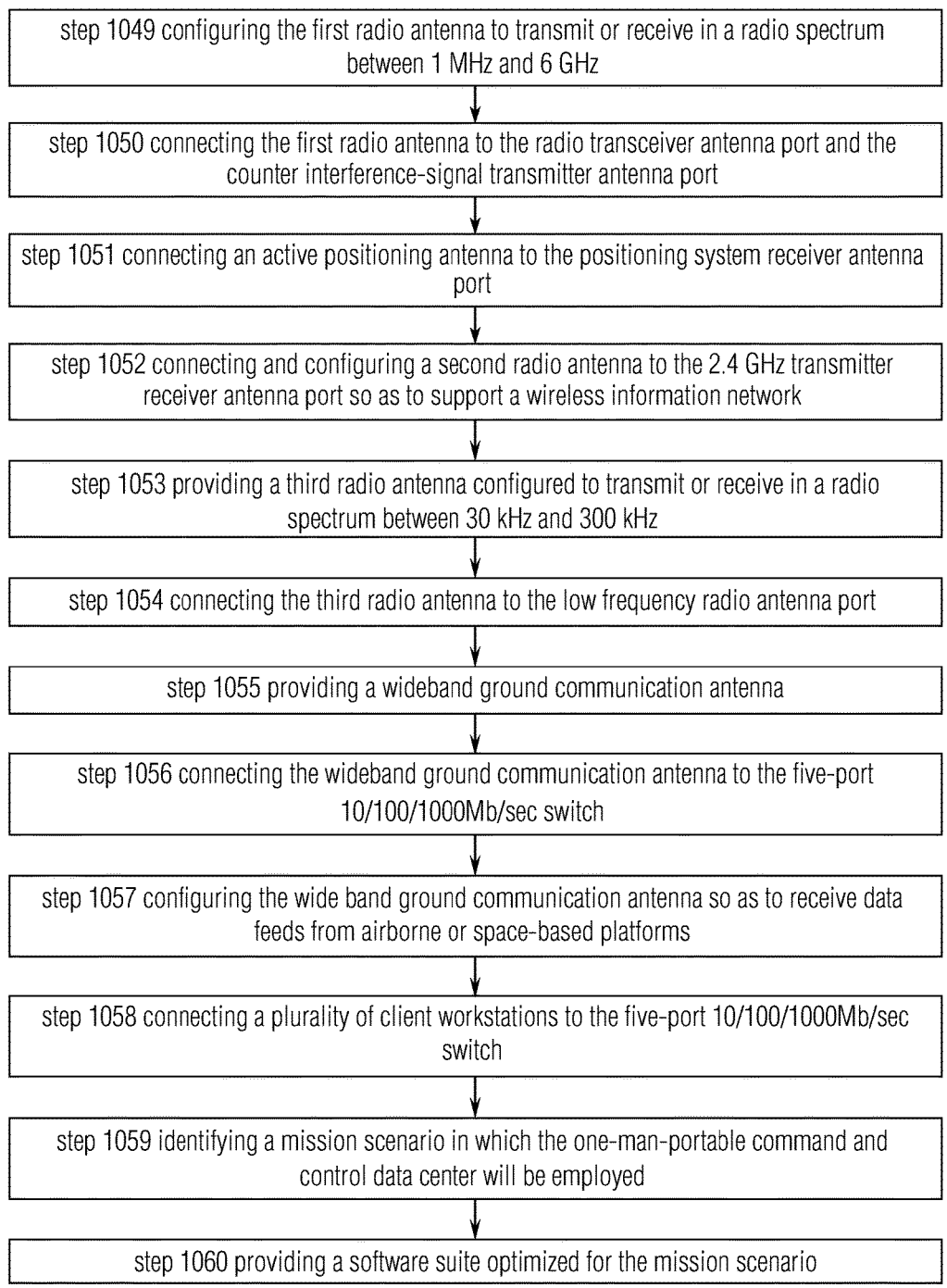

FIG. 23F shows a continuation of a method for assembling a one-person-portable command and control data center 101 comprising the steps of: step 1049: configuring the first radio antenna to transmit or receive in a radio spectrum between 1 MHz and 6 GHz; step 1050: connecting the first radio antenna to the radio transceiver antenna port and the counter interference-signal transmitter antenna port; step 1051: connecting an active positioning antenna to the positioning system receiver antenna port; step 1052: connecting and configuring a second radio antenna to the 2.4 GHz transmitter receiver antenna port so as to support a wireless information network; step 1053: providing a third radio antenna configured to transmit or receive in a radio spectrum between 30 kHz and 300 kHz; step 1054: connecting the third radio antenna to the low frequency radio antenna port; step 1055: providing a wideband ground communication antenna; step 1056: connecting the wideband ground communication antenna to the five-port 10/100/1000 Mb/sec switch; step 1057: configuring the wideband ground communication antenna so as to receive data feeds from airborne or space-based platforms; step 1058: connecting a plurality of client workstations to the five-port 10/100/1000 Mb/sec switch; step 1059: identifying a mission scenario in which the one-person-portable command and control data center 101 will be employed; and step 1060: providing a software suite optimized for the mission scenario.

Figure 24A:
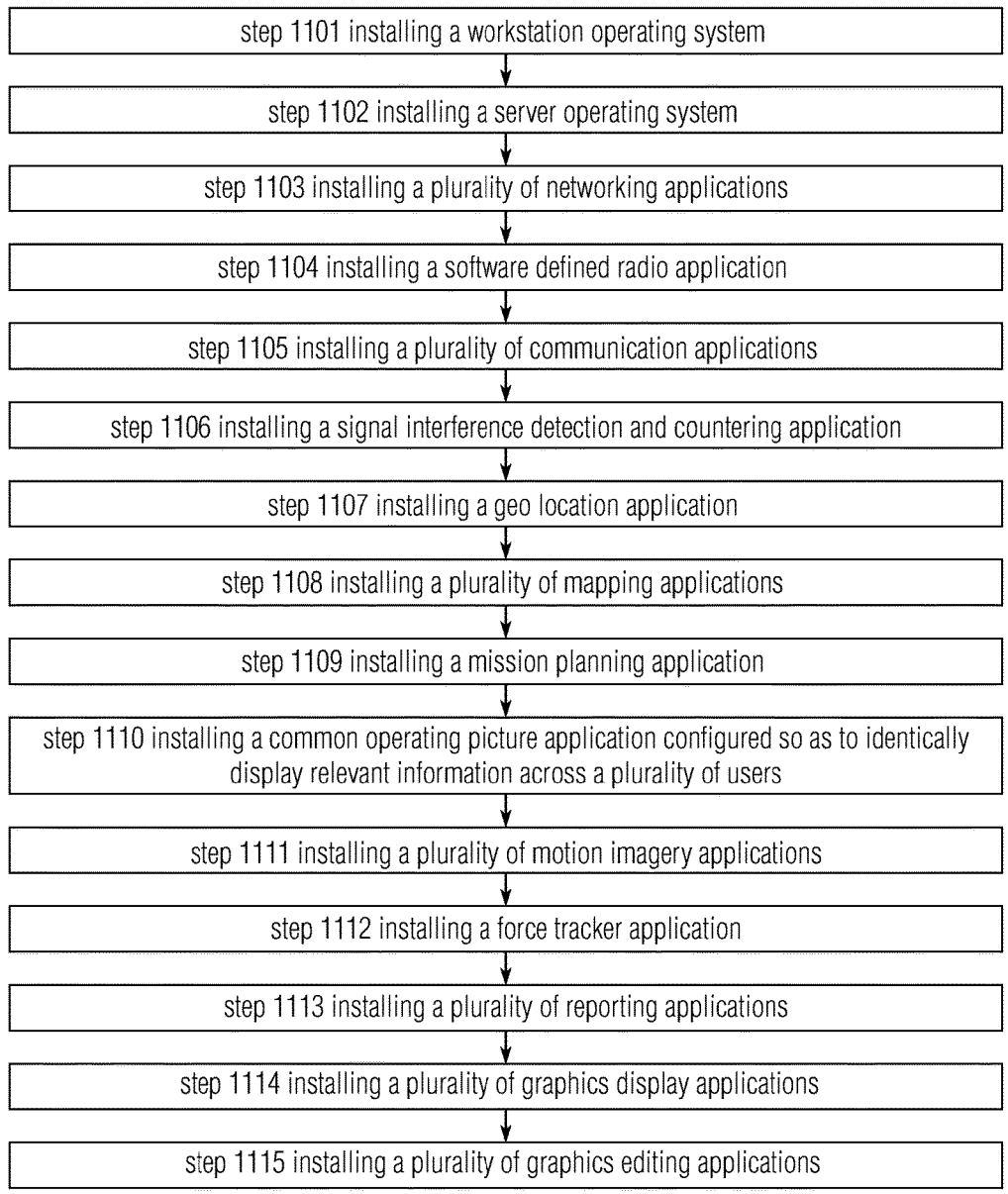
FIGS. 24A and 24B show an exemplary method for optimizing a one-person-portable command and control data center to establish command and control.

FIG. 24A shows a method for optimizing a one-person-portable command and control data center 101 to establish command and control; step 1101: installing a workstation operating system; step 1102: installing a server operating system; step 1103: installing a plurality of networking applications; step 1104: installing a software defined radio application; step 1105: installing a plurality of communication applications; step 1106: installing a signal interference detection and countering application; step 1107: installing a geo location application; step 1108: installing a plurality of mapping applications; step 1109: installing a mission planning application; step 1110: installing a common operating picture application configured so as to identically display relevant information across a plurality of users; step 1111: installing a plurality of motion imagery applications; step 1112: installing a force tracker application; step 1113: installing a plurality of reporting applications; step 1114: installing a plurality of graphics display applications; and step 1115: installing a plurality of graphics editing applications.

Figure 24B:
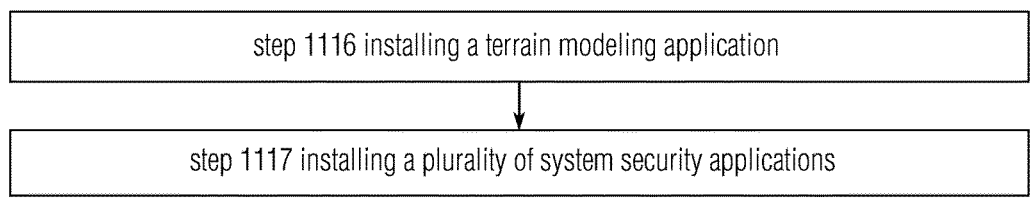

FIG. 24B shows a continuation of a method for optimizing a one-person-portable command and control data center 101 to establish command and control; step 1116: installing a terrain modeling application; step 1117: installing a plurality of system security applications.

Figure 25A:
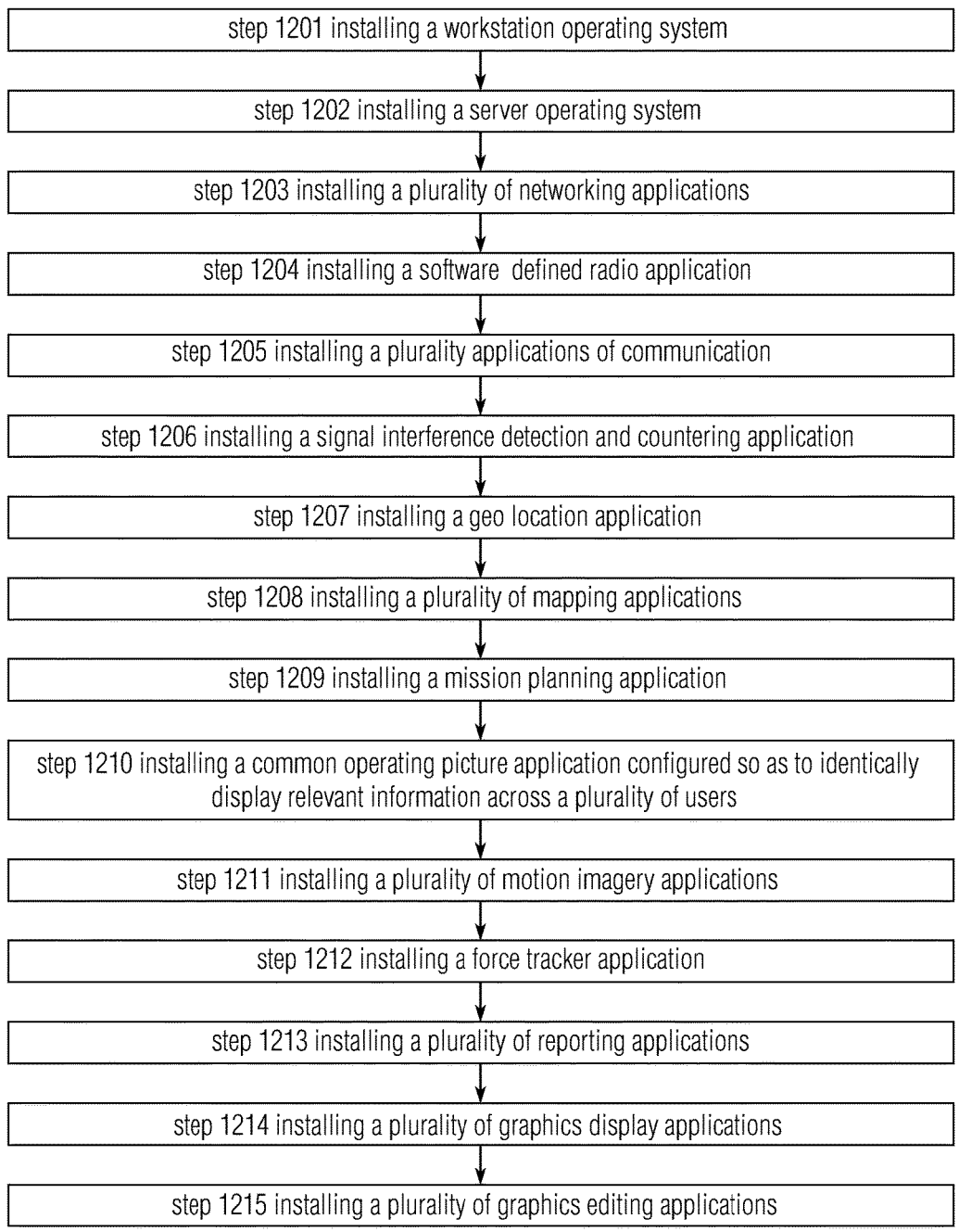
FIGS. 25A and 25B show an exemplary method for optimizing a one-person-portable command and control data center for incident response.

FIG. 25A shows a method for optimizing a one-person-portable command and control data center 101 for incident response: step 1201: installing a workstation operating system; step 1202: installing a server operating system; step 1203: installing a plurality of networking applications; step 1204: installing a software defined radio application; step 1205: installing a plurality of communication applications; step 1206: installing a signal interference detection and countering application; step 1207: installing a geo location application; step 1208: installing a plurality of mapping applications; step 1209: installing a mission planning application; step 1210: installing a common operating picture application configured so as to identically display relevant information across a plurality of users; step 1211: installing a plurality of motion imagery applications; step 1212:

installing a force tracker application; step 1213: installing a plurality of reporting applications; step 1214: installing a plurality of graphics display applications; and step 1215: installing a plurality of graphics editing applications.

Figure 25B:
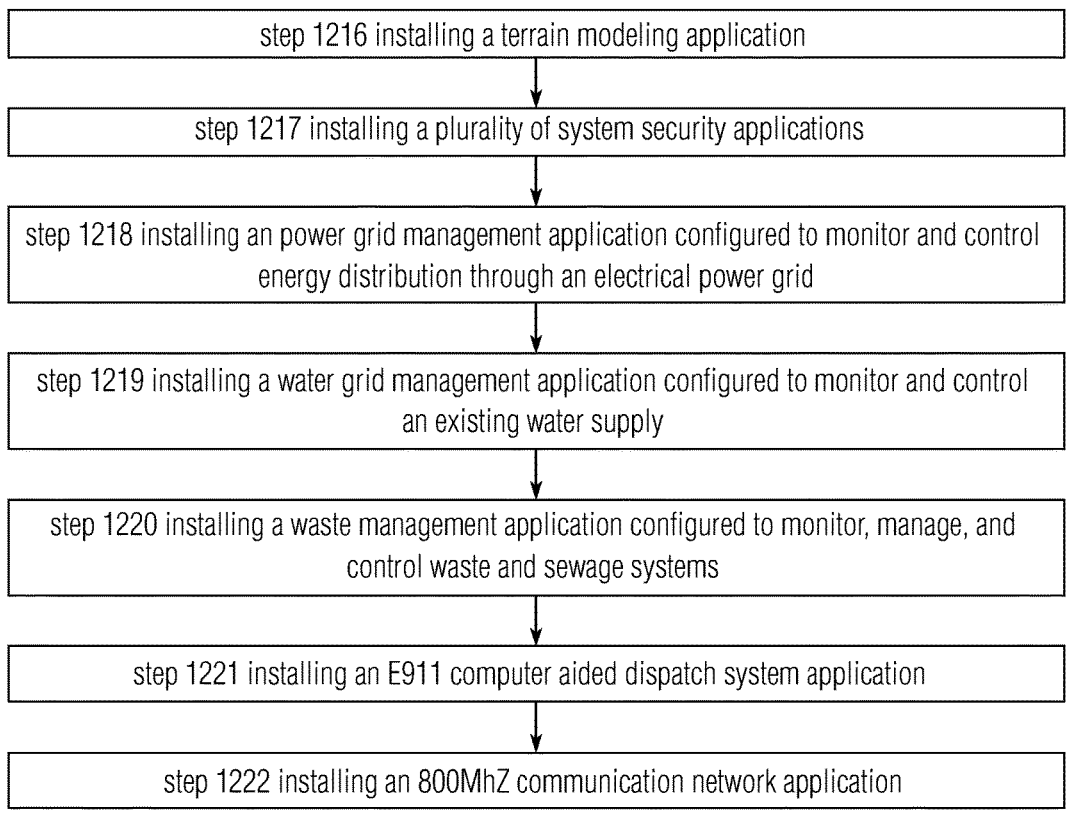

FIG. 25B shows a continuation of a method for optimizing a one-person-portable command and control data center 101 for incident response; step 1216: installing a terrain modeling application; step 1217: installing a plurality of system security applications; step 1218: installing an power grid management application configured to monitor and control energy distribution through an electrical power grid; step 1219: installing a water grid management application configured to monitor and control an existing water supply; step 1220: installing a waste management application configured to monitor, manage, and control waste and sewage systems; step 1221: installing an E911 computer aided dispatch system application; step 1222: installing an 800 MhZ communication network application.

Figure 26A:
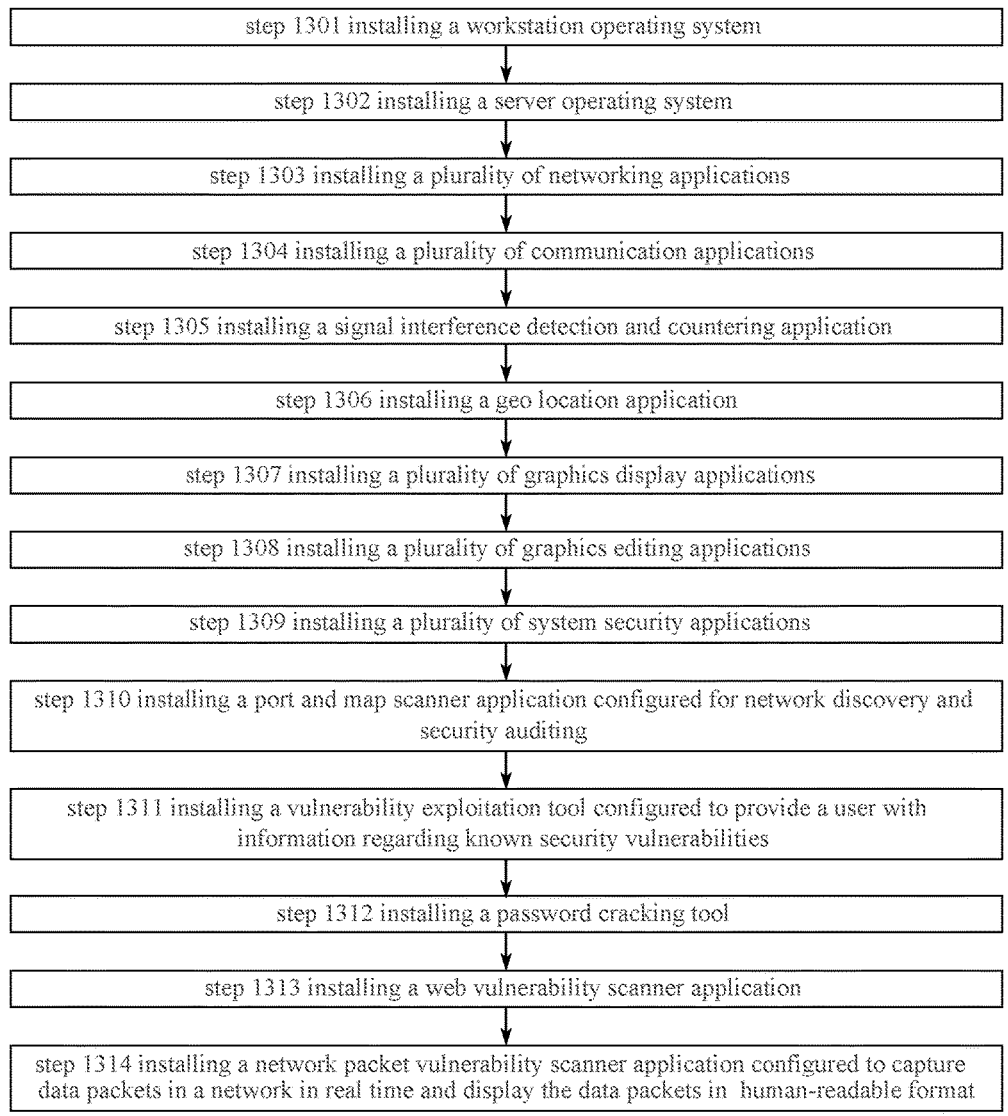
FIGS. 26A and 26B show an exemplary method for optimizing a one-person-portable command and control data center for network penetration testing.

FIG. 26A shows a method for optimizing a one-person-portable command and control data center 101 for network penetration testing; step 1301: installing a workstation operating system; step 1302: installing a server operating system; step 1303: installing a plurality of networking applications; step 1304: installing a plurality of communication applications; step 1305: installing a signal interference detection and countering application; step 1306: installing a geo location application; step 1307: installing a plurality of graphics display applications; step 1308: installing a plurality of graphics editing applications; step 1309: installing a plurality of system security applications; step 1310: installing a port and map scanner application configured for network discovery and security auditing; step 1311: installing a vulnerability exploitation tool configured to provide a user with information regarding known security vulnerabilities; step 1312: installing a password cracking tool; step 1313: installing a web vulnerability scanner application; step 1314: installing a network packet vulnerability scanner application configured to capture data packets in a network in real time and display the data packets in human-readable format.

Figure 26B:
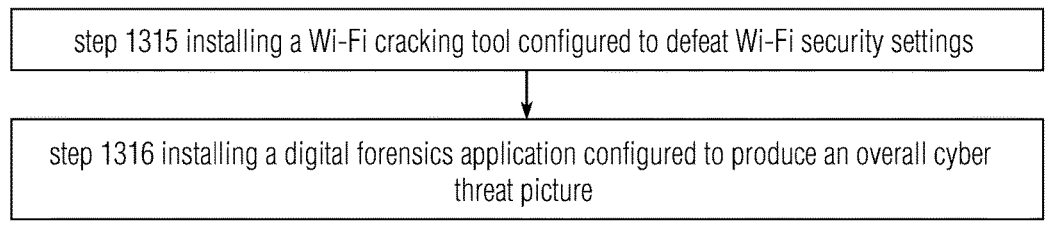

FIG. 26B shows a continuation of a method for optimizing a one-person-portable command and control data center 101 for network penetration testing; step 1315: installing a Wi-Fi cracking tool configured to defeat Wi-Fi security settings; step 1316: installing a digital forensics application configured to produce an overall cyber threat picture.

Figure 27A:
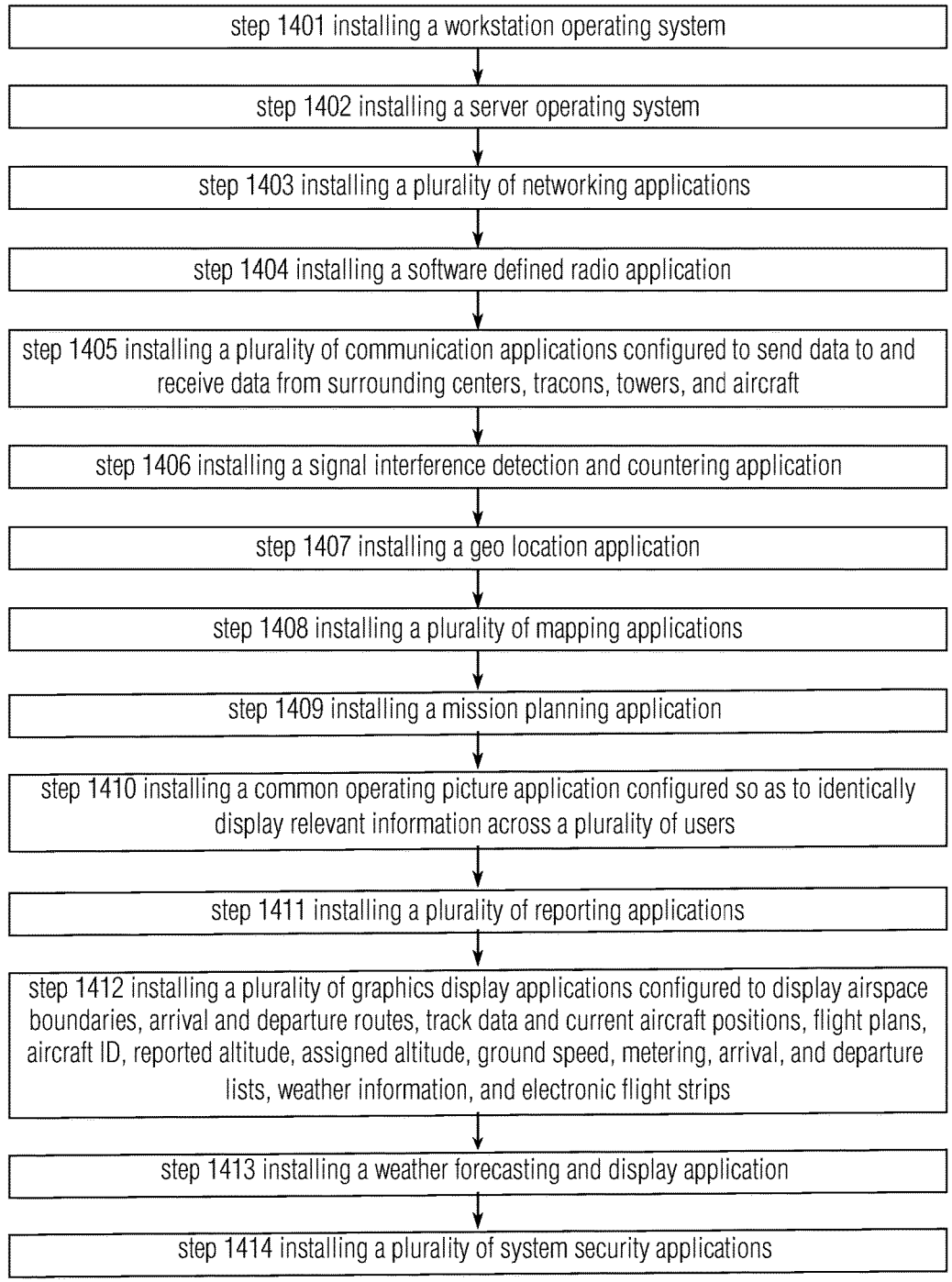

FIG. 27A shows a method for optimizing a one-person-portable command and control data center 101 to establish air traffic control; step 1401: installing a workstation operating system; step 1402: installing a server operating system; step 1403: installing a plurality of networking applications; step 1404: installing a software defined radio application; step 1405: installing a plurality of communication applications configured to send data to and receive data from surrounding centers, aviation terminal radar approach control (TRACON) centers, towers, and aircraft; step 1406: installing a signal interference detection and countering application; step 1407: installing a geo location application; step 1408: installing a plurality of mapping applications; step 1409: installing a mission planning application; step 1410: installing a common operating picture application configured so as to identically display relevant information across a plurality of users; step 1411: installing a plurality of reporting applications; step 1412: installing a plurality of graphics display applications configured to display airspace boundaries, arrival and departure routes, track data and current aircraft positions, flight plans, aircraft ID, reported altitude, assigned altitude, ground speed, metering, arrival, and departure lists, weather information, and electronic flight strips; step 1413: installing a weather forecasting and display application; and step 1414: installing a plurality of system security applications.

FIG. 27B shows a continuation of a method for optimizing a one-person-portable command and control data center 101 to establish air traffic control: step 1415: installing an air traffic control application configured to provide track prediction, conflict probe and alert functionality, resolution advisories, minimum safe altitude advisory warnings, and time-based arrival and departure metering; step 1416: installing a data recording, reduction and analysis application configured to record and facilitate analysis of any and all aircraft flight, track, display, and controller input, internal process functionality, inter-process communication, inter-center and inter-TRACON communications.

Figure 28:
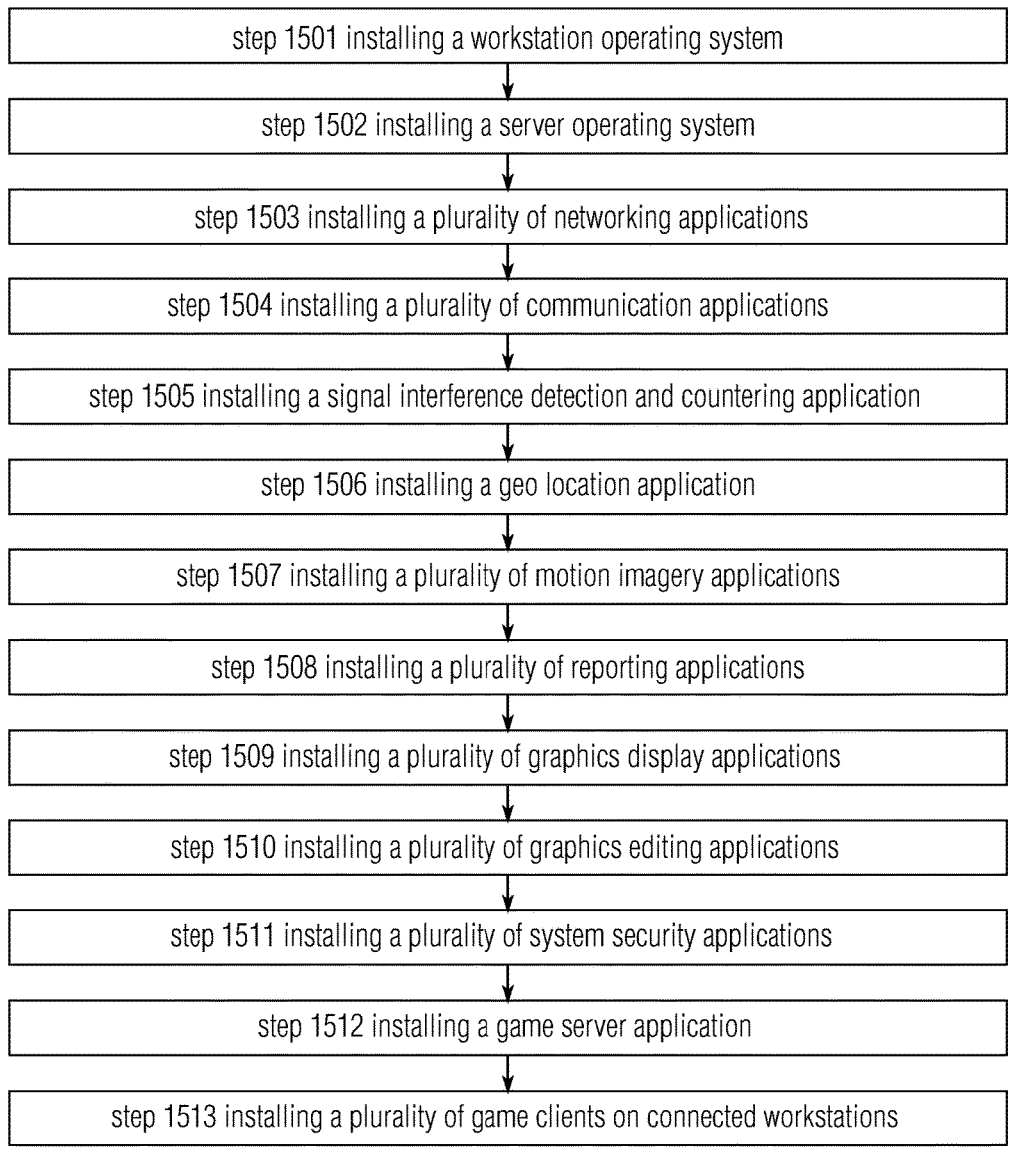
FIG. 28 shows an exemplary method for optimizing a one-person-portable command and control data center to establish a temporary gaming network.

FIG. 28 shows a method for optimizing a one-person-portable command and control data center 101 to establish a temporary gaming network including: step 1501: installing a workstation operating system; step 1502: installing a server operating system; step 1503: installing a plurality of networking applications; step 1504: installing a plurality of communication applications; step 1505: installing a signal interference detection and countering application; step 1506: installing a geo location application; step 1507: installing a plurality of motion imagery applications; step 1508: installing a plurality of reporting applications; step 1509: installing a plurality of graphics display applications; step 1510: installing a plurality of graphics editing applications; step 1511: installing a plurality of system security applications; step 1512: installing a game server application; and step 1513: installing a plurality of game clients on connected workstations.

An additional embodiment of the invention could include the inclusion of a conductive material in the case construction so as to create a faraday cage around the interior components of the person-portable command and control data center 101.

An additional embodiment of the invention could include forming the case in such a manner so as to protect the internal components from environmental contamination through the use of seals and filters.

An additional embodiment of the invention could include forming the case to make it more resistant to impact damage through the utilization of carbon fibers in the formation. Additionally, a pair of covers could be included to protect the first and second vertical faces during transport. Such covers could be coupled to the vertical back plate by hinges and could include latching mechanisms oriented to capture a formed protrusion on an outer edge face of the second monitor support plate. When latched, the covers would overlap the first and second vertical faces, thus protecting the formed apertures in both during transportation. To put the person-portable command and control data center 101 into operation, the covers could be unlatched and swung toward the vertical back plate, clearing the apertures in the first and second vertical sides.

Although the invention has been described in detail with reference to certain preferred embodiments, variations and modifications exist within the spirit and scope of the invention as described and defined in the following claims.

The invention claimed is:

1. A person-portable command and control data center comprising:
 a case with a horizontal top opposed opposite a horizontal bottom, a first vertical side coupled to said horizontal top and said horizontal bottom, a second vertical side opposed opposite said first vertical side and coupled to said horizontal top and said horizontal bottom, a vertical back plate coupled to said horizontal top, said horizontal bottom, said first vertical side, and said second vertical slide, a vertical front plate disposed opposite said vertical back plate coupled to said horizontal top, said horizontal bottom, said first vertical side, and said second vertical slide;

a carrying handle coupled to an exterior face of said horizontal top at such a balance point as dictated by a weight distribution of a plurality of components coupled to, and housed within said case;

said first vertical side being formed with a plurality of apertures;

said second vertical side being formed with a plurality of apertures;

said plurality of components comprising a user configurable power supply, a workstation motherboard, a server motherboard, a plurality of data storage devices, a radio transceiver, a five-port 10/100/1000 Mb/sec switch, a fiber optic network card, a sealed liquid cooling system, a positioning system receiver, a counter interference-signal transmitter, a low frequency radio, a 2.4 GHz transmitter receiver, a first monitor, a second monitor, a first hinged monitor support plate, a third monitor, a second hinged monitor support plate, a first pivot hinge, a second pivot hinge, a third pivot hinge, a fourth pivot hinge, and a removable keyboard;

said user configurable power supply coupled to an inner face of said case and configured so as to accept a variety of power inputs and convert said inputs into an output signal with a waveform of 110 v at 60 Hz and 15 amps;

said workstation motherboard coupled to an inner face of said case comprising a workstation central processing unit, a plurality of random access memory chips, and a first 3D video card;

said server motherboard disposed parallel to said workstation motherboard at a location so as to create a separation of less than 1.8 inches between a face of said workstation motherboard and a face of said server motherboard, comprising a first central processing unit, a second central processing unit, a plurality of random access memory chips, and a second 3D video card;

said plurality of data storage devices secured within said case and connected to one or more said motherboards;

said data storage devices being coupled to a formed tray, disposed in proximity to said second vertical side, and secured by a quick release mechanism so as to allow rapid removal of said data storage devices;

said radio transceiver comprising an antenna port accessible through a selected aperture in said first vertical side, coupled to an inner face of said case, and connected to said workstation motherboard;

said five-port 10/100/1000 Mb/sec switch comprising a plurality of ports accessible through a selected aperture in said first vertical side coupled to an inner face of said case and connected to said server motherboard and to said workstation motherboard;

said fiber optic network card comprising a plurality of ports accessible through a selected aperture in said first vertical side coupled to an inner face of said case and connected to either of said motherboards;

said sealed liquid cooling system comprising a quantity of heat transfer fluid, a radiator having a plurality of radiator pipe coupling ports, a first fluid input pipe, a second fluid input pipe, a first fluid output pipe, a second fluid output pipe, a first heat sink and pump, a second heat sink and pump, a third heat sink and pump, and a plurality of wires configured to transmit an activation signal from said motherboards;

said fluid input pipes and said fluid output pipes being coupled to said radiator pipe coupling ports;

said first heat sink and pump being disposed in contact with said first central processing unit, coupled to said first fluid input pipe, coupled to said first fluid output pipe, and coupled to a portion of said wires;

said second heat sink and pump being disposed in contact with said second central processing unit, coupled to said first fluid input pipe, coupled to said first fluid output pipe, and coupled to a portion of said wires;

said third heat sink and pump being disposed in contact with said workstation central processing unit, coupled to said second fluid input pipe, coupled to said second fluid output pipe, and coupled to a portion of said wires;

said radiator being disposed within three 5.25 inch drive bays proximal to said horizontal bottom and said second vertical side;

said radiator being contained entirely within said case;

said sealed liquid cooling system being configured so as to allow a quantity of waste heat to pass from said central processing units to a portion of said heat transfer fluid, said portion of heat transfer fluid to be transported within said fluid input pipes to said radiator, said radiator being configured to allow a quantity of waste heat to pass from said portion of heat transfer fluid to a portion of proximal ambient air, said portion of heat transfer fluid to be transported within said fluid output pipes to said heat sinks and pumps;

said radiator being further configured so as to passively power a convection current as said heated portion of proximal air rises within said case and exits said case through a plurality of first apertures and air pathways and a portion of cooler ambient temperature air is drawn through a plurality of second apertures in and from a lower portion of said second vertical side to facilitate a convection air current created from a resultant low pressure area proximal to said radiator, said plurality of components contained within said case being positioned so as to facilitate said convection current;

said positioning system receiver comprising an antenna port accessible through a selected aperture in said first vertical side, secured within said case and connected to said server motherboard;

said counter interference-signal transmitter comprising an antenna port accessible through a selected aperture in said first vertical side, secured within said case and connected to said workstation motherboard;

said counter interference-signal transmitter being configured so as to produce a signal capable of defeating detected interference signals;

said low frequency radio comprising an antenna port accessible through a selected aperture in said first vertical side, secured within said case and connected to said workstation motherboard;

said 2.4 GHz transmitter receiver comprising an antenna port accessible through a selected aperture in said first vertical side, secured within said case and connected to said workstation motherboard;

said first monitor a secured to a monitor bracket coupled to said vertical front plate, connected to said first 3D video card, and connected to said user configurable power supply;

said case having a height of 1.06 times said first monitor's height, a length of 1.08 times said first monitor's length, and a depth of 11.25 said first monitor's depth;

said second monitor secured to said first hinged monitor support plate, connected to said first 3D video card, and connected to said user configurable power supply;

said first hinged monitor support plate being coupled by said first pivot hinge to an interior face of said horizontal top, by said second pivot hinge to an interior face of said horizontal bottom, and configured so as to enable said second monitor to be folded through an arc from an extend position in line with said first monitor, toward said first monitor, to a position parallel to, and in contact with said first monitor, creating a first closed position;

said third monitor secured to said second hinged monitor support plate, connected to said first 3D video card, and connected to said user configurable power supply;

said second hinged monitor support plate being coupled by said third pivot hinge to said interior face of said horizontal top, by said fourth pivot hinge to said interior face of said horizontal bottom, and configured so as to enable said third monitor to be folded through an arc from an extend position in line with said first monitor, toward said second monitor to a position parallel to, and in contact with said second monitor in said first closed position, creating a second closed position;

said second hinged monitor support plate further comprising a plurality of fixtures configured to support said removable keyboard disposed on a face opposite said third monitor;

said removable keyboard comprising a plurality of locking pins disposed so as to penetrate a matching plurality of said support fixtures and create a secure coupling between said keyboard and said second hinged monitor support plate;

a first radio antenna formed with a plurality of facets connected to said radio transceiver antenna port and said counter interference-signal transmitter antenna port being configured to transmit or receive in a radio spectrum between 1 MHz and 6 GHz;

an active positioning antenna connected to said positioning system receiver antenna port;

a second radio antenna connected to said 2.4 GHz transmitter receiver antenna port being configured so as to support a wireless information network;

a third radio antenna connected to said low frequency radio antenna port being configured so as to transmit or receive in a radio spectrum between 30 kHz and 300 kHz;

a wideband ground communication antenna connected to said five-port 10/100/1000 Mb/sec switch and configured so as to receive data feeds from airborne or space-based platforms;

a plurality of client workstations networked to said five-port 10/100/1000 Mb/sec switch;

a command and control software suite comprising a workstation operating system, a server operating system, a plurality of networking applications, a software defined radio application, a plurality of communication applications, a signal interference detection and countering application, a geo location application, a plurality of mapping applications, a mission planning application, a common operating picture application configured so as to identically display relevant information across a plurality of users, a plurality of motion imagery applications, a force tracker application, a plurality of reporting applications, a plurality of graphics display applications, a plurality of graphics editing applications, a terrain modeling application, and a plurality of system security applications.

2. A one-person-portable command and control data center comprising:

a case with a horizontal top opposed opposite a horizontal bottom, a first vertical side coupled to said horizontal top and said horizontal bottom, a second vertical side opposed opposite said first vertical side and coupled to said horizontal top and said horizontal bottom, a vertical back plate coupled to said horizontal top, said horizontal bottom, said first vertical side, and said second vertical slide, a vertical front plate disposed opposite said vertical back plate coupled to said horizontal top, said horizontal bottom, said first vertical side, and said second vertical slide;

a carrying handle coupled to an exterior face of said horizontal top at a balance point;

said first vertical side being formed with a plurality of apertures;

said second vertical side being formed with a plurality of apertures;

a user configurable power supply coupled to an inner face of said case and configured so as to accept a variety of power inputs and convert said inputs into an output signal with a waveform of 110 v at 60 Hz and 15 amps;

a workstation motherboard coupled to an inner face of said case comprising a workstation central processing unit, a plurality of random access memory chips, and a first 3D video card;

a server motherboard disposed parallel to said workstation motherboard at a location so as to create a separation of less than 1.8 inches between a face of said workstation motherboard and a face of said server motherboard, comprising a first central processing unit, a second central processing unit, a plurality of random access memory chips, and a second 3D video card;

a plurality of communication modules;

a plurality of data storage devices secured within said case and connected to one or more said motherboards;

said data storage devices being coupled to a formed tray, disposed in proximity to said second vertical side, and secured by a quick release mechanism so as to allow rapid removal of said data storage devices;

a first monitor secured to a monitor bracket coupled to said vertical front plate, connected to said first 3D video card, and connected to said user configurable power supply;

said case having a height of 1.06 times said first monitor's height, a length of 1.08 times said first monitor's length, and a depth of 11.25 said first monitor's depth;

a second monitor secured to a first hinged monitor support plate, connected to said first 3D video card, and connected to said user configurable power supply;

said first hinged monitor support plate being coupled by a first pivot hinge to an interior face of said horizontal top, by a second pivot hinge to an interior face of said horizontal bottom, and configured so as to enable said second monitor to be folded through an arc from an extend position in line with said first monitor, toward said first monitor, to a position parallel to, and in contact with said first monitor, creating a first closed position;

a third monitor secured to a second hinged monitor support plate, connected to said first 3D video card, and connected to said user configurable power supply;

said second hinged monitor support plate being coupled by a third pivot hinge to said interior face of said horizontal top, by a fourth pivot hinge to said interior face of said horizontal bottom, and configured so as to enable said third monitor to be folded through an arc from an extend position in line with said first monitor, toward said second monitor to a position parallel to, and in contact with said second monitor in said first closed position, creating a second closed position;

wherein said second hinged monitor support plate further comprising a plurality of fixtures configured to support a removable keyboard disposed on a face opposite said third monitor;

wherein said removable keyboard comprising a plurality of locking pins disposed so as to penetrate a matching plurality of said support fixtures and create a secure coupling between said keyboard and said second hinged monitor support plate.

3. The one-person-portable command and control data center of claim 2 wherein said plurality of communication modules further comprises:

a radio transceiver comprising an antenna port accessible through a selected aperture in said first vertical side, coupled to an inner face of said case, and connected to said workstation motherboard;

a five-port 10/100/1000 Mb/sec switch comprising a plurality of ports accessible through a selected aperture in said first vertical side coupled to an inner face of said case and connected to said server motherboard and to said workstation motherboard;

a fiber optic network card comprising a plurality of ports accessible through a selected aperture in said first vertical side coupled to an inner face of said case and connected to either of said motherboards;

a positioning system receiver comprising an antenna port accessible through a selected aperture in said first vertical side, secured within said case and connected to said server motherboard;

a low frequency radio comprising an antenna port accessible through a selected aperture in said first vertical side, secured within said case and connected to said workstation motherboard;

a 2.4 GHz transmitter receiver comprising an antenna port accessible through a selected aperture in said first vertical side secured within said case and connected to said workstation motherboard.

4. The one-person-portable command and control data center of claim 2 further comprising:

a sealed liquid cooling system comprising a quantity of heat transfer fluid, a radiator having a plurality of pipe coupling ports, a first fluid input pipe, a second fluid input pipe, a first fluid output pipe, a second fluid output pipe, a first heat sink and pump, a second heat sink and pump, a third heat sink and pump, and a plurality of wires configured to transmit an activation signal from said motherboards;

said fluid input pipes and said fluid output pipes being coupled to said radiator pipe coupling ports;

said first heat sink and pump being disposed in contact with said first central processing unit, coupled to said first fluid input pipe, coupled to said first fluid output pipe, and coupled to a portion of said wires;

said second heat sink and pump being disposed in contact with said second central processing unit, coupled to said first fluid input pipe, coupled to said first fluid output pipe, and coupled to a portion of said wires;

said third heat sink and pump being disposed in contact with said workstation central processing unit, coupled to said second fluid input pipe, coupled to said second fluid output pipe, and coupled to a portion of said wires;

said radiator being disposed within three 5.25 inch drive bays proximal to said horizontal bottom and said second vertical side;

said radiator being contained entirely within said case;

said sealed liquid cooling system being configured so as to allow a quantity of waste heat to pass from said central processing units to a portion of said heat transfer fluid, said portion of heat transfer fluid to be transported within said fluid input pipes to said radiator, said radiator being configured to allow a quantity of waste heat to pass from said portion of heat transfer fluid to a portion of proximal ambient air, said portion of heat transfer fluid to be transported within said fluid output pipes to said heat sinks and pumps;

said radiator being further configured so as to passively power a convection current as said heated portion of proximal air rises within said case and exits said case through a plurality of first apertures and airways and a portion of cooler ambient temperature air is drawn through a plurality of second apertures and airways in a lower portion of said second vertical side to facilitate a convection air current towards a resultant low pressure area proximal to said radiator.

5. The one-person-portable command and control data center of claim 3 further comprising:

a liquid cooling system comprising a quantity of heat transfer fluid, a radiator having a plurality of pipe coupling ports, a first fluid input pipe, a second fluid input pipe, a first fluid output pipe, a second fluid output pipe, a first heat sink and pump, a second heat sink and pump, a third heat sink and pump, and a plurality of wires configured to transmit an activation signal from said motherboards;

wherein said fluid input pipes and said fluid output pipes being coupled to said radiator pipe coupling ports;

wherein said first heat sink and pump being disposed in contact with said first central processing unit, coupled to said first fluid input pipe, coupled to said first fluid output pipe, and coupled to a portion of said wires;

wherein said second heat sink and pump being disposed in contact with said second central processing unit, coupled to said first fluid input pipe, coupled to said first fluid output pipe, and coupled to a portion of said wires;

wherein said third heat sink and pump being disposed in contact with said workstation central processing unit, coupled to said second fluid input pipe, coupled to said second fluid output pipe, and coupled to a portion of said wires;

wherein said radiator being disposed within three drive bays proximal to said horizontal bottom and said second vertical side;

wherein said radiator being contained entirely within said case;

wherein said liquid cooling system being configured so as to allow a quantity of waste heat to pass from said central processing units to a portion of said heat transfer fluid, said portion of heat transfer fluid to be transported within said fluid input pipes to said radiator, said radiator being configured to allow a quantity of waste heat to pass from said portion of heat transfer fluid to a portion of proximal ambient air, said portion of heat transfer fluid to be transported within said fluid output pipes to said heat sinks and pumps;

wherein said radiator being further configured so as to passively power a convection current as said heated portion of proximal air rises within said case and exits said case through a plurality of first apertures in said case and a portion of cooler ambient temperature air is drawn through a second plurality of apertures in a lower portion of said second vertical side to fill a resultant low pressure area proximal to said radiator, said claimed components of said one-person-portable command and control data center contained within said case being positioned so as to facilitate said convection current.

6. The one-person-portable command and control data center of claim 4 further comprising:

a counter interference-signal transmitter comprising an antenna port accessible through a selected aperture in said first vertical side, secured within said case and connected to said workstation motherboard;

said counter interference-signal transmitter being configured so as to produce a signal capable of defeating detected interference signals.

7. The one-person-portable command and control data center of claim 5 further comprising:

a counter interference-signal transmitter comprising an antenna port accessible through a selected aperture in said first vertical side, secured within said case and connected to said workstation motherboard;

said counter interference-signal transmitter being configured so as to produce a signal capable of defeating detected interference signals.

8. The one-person-portable command and control data center of claim 7 further comprising:

a first radio antenna formed with a plurality of facets connected to said radio transceiver antenna port and said counter interference-signal transmitter antenna port being configured to transmit or receive in a radio spectrum between 1 MHz and 6 GHz;

an active positioning antenna connected to said positioning system receiver antenna port;

a second radio antenna connected to said 2.4 GHz transmitter receiver antenna port being configured so as to support a wireless information network;

a third radio antenna connected to said low frequency radio antenna port being configured so as to transmit or receive in a radio spectrum between 30 kHz and 300 kHz;

a wideband ground communication antenna connected to said five-port 10/100/1000 Mb/sec switch and configured so as to receive data feeds from airborne or space-based platforms.

9. The one-person-portable command and control data center of claim 8 further comprising:

a plurality of client workstations networked to said five-port 10/100/1000 Mb/sec switch.

10. The one-person-portable command and control data center of claim 4 further comprising:

a command and control software suite comprising a workstation operating system, a server operating system, a plurality of networking applications, a software defined radio application, a plurality of communication applications, a signal interference detection and countering application, a geo location application, a plurality of mapping applications, a mission planning application, a common operating picture application configured so as to identically display relevant information across a plurality of users, a plurality of motion imagery applications, a force tracker application, a plurality of reporting applications, a plurality of graphics display applications, a plurality of graphics editing applications, a terrain modeling application, and a plurality of system security applications.

11. The one-person-portable command and control data center of claim 9 further comprising:

a command and control software suite comprising a workstation operating system, a server operating system, a plurality of networking applications, a software defined radio application, a plurality of communication applications, a signal interference detection and countering application, a geo location application, a plurality of mapping applications, a mission planning application, a common operating picture application configured so as to identically display relevant information across a plurality of users, a plurality of motion imagery applications, a force tracker application, a plurality of reporting applications, a plurality of graphics display applications, a plurality of graphics editing applications, a terrain modeling application, and a plurality of system security applications.

12. The one-person-portable command and control data center of claim 4 further comprising:

an incident response software suite comprising a workstation operating system, a server operating system, a plurality of networking applications, a software defined radio a plurality of communication applications, a signal interference detection and countering application, a geo location application, a plurality of mapping applications, a mission planning application, a common operating picture application configured so as to identically display relevant information across a plurality of users, a plurality of motion imagery applications, a force tracker application, a plurality of reporting applications, a plurality of graphics display applications, a plurality of graphics editing applications, a terrain modeling application, a plurality of system security applications, a power grid management application configured so as to monitor and control energy distribution through an electrical power grid, a water grid management application configured so as to monitor and control an existing water supply, a waste management application configured so as to monitor, manage, and control waste and sewage systems, an E911 computer aided dispatch system application, an 800 MhZ communication network application.

13. The one-person-portable command and control data center of claim 9 further comprising:

an incident response software suite comprising a workstation operating system, a server operating system, a plurality of networking applications, a software defined radio a plurality of communication applications, a signal interference detection and countering application, a geo location application, a plurality of mapping applications, a mission planning application, a common operating picture application configured so as to identically display relevant information across a plurality of users, a plurality of motion imagery applications, a force tracker application, a plurality of reporting applications, a plurality of graphics display applications, a plurality of graphics editing applications, a terrain modeling application, a plurality of system security applications, a power grid management application configured so as to monitor and control energy distribution through an electrical power grid, a water grid management application configured so as to monitor and control an existing water supply, a waste management application configured so as to monitor, manage, and control waste and sewage systems, an E911 computer aided dispatch system application, an 800 MhZ communication network application.

14. The one-person-portable command and control data center of claim 4 further comprising:
a network penetration software suite comprising a workstation operating system, a server operating system, a plurality of networking applications, a plurality of communication applications, a signal interference detection and countering application, a geo location application, a plurality of graphics display applications, a plurality of graphics editing applications, a plurality of system security applications, a port and map scanner application configured so as to enable network discovery and security auditing, a vulnerability exploitation tool configured so as to provide a user with information regarding known security vulnerabilities, a password cracking tool, a web vulnerability scanner application, a network packet vulnerability scanner application configured so as to capture data packets in a network in real time and display said data packets in human-readable format, a Wi-Fi cracking tool configured so as to defeat Wi-Fi security settings, a digital forensics application configured so as to produce an overall cyber threat picture.

15. The one-person-portable command and control data center of claim 9 further comprising:
a network penetration software suite comprising a workstation operating system, a server operating system, a plurality of networking applications, a plurality of communication applications, a signal interference detection and countering application, a geo location application, a plurality of graphics display applications, a plurality of graphics editing applications, a plurality of system security applications, a port and map scanner application configured so as to enable network discovery and security auditing, a vulnerability exploitation tool configured so as to provide a user with information regarding known security vulnerabilities, a password cracking tool, a web vulnerability scanner application, a network packet vulnerability scanner application configured so as to capture data packets in a network in real time and display said data packets in human-readable format, a Wi-Fi cracking tool configured so as to defeat Wi-Fi security settings, a digital forensics application configured so as to produce an overall cyber threat picture.

16. The one-person-portable command and control data center of claim 4 further comprising:
an air traffic control software suite comprising a workstation operating system, a server operating system, a plurality of networking applications, a software defined radio application, a plurality of communication applications configured so as to send data to and receive data from surrounding centers, tracons, towers, and aircraft, a signal interference detection and countering application, a geo location application, a plurality of mapping applications, a mission planning application, a common operating picture application configured so as to identically display relevant information across a plurality of users, a plurality of reporting applications, a plurality of graphics display applications configured so as to display airspace boundaries, arrival and departure routes, track data and current aircraft positions, flight plans, aircraft ID, reported altitude, assigned altitude, ground speed, metering, arrival, and departure lists, weather information, and electronic flight strips, a weather forecasting and display application, a plurality of system security applications, an air traffic control application configured so as to provide track prediction, conflict probe and alert functionality, resolution advisories, minimum safe altitude advisory warnings, and time-based arrival and departure metering, a data recording, reduction and analysis application configured so as to record and facilitate analysis of any and all aircraft flight, track, display, and controller input, internal process functionality, interprocess communication, inter-center and inter-tracon communications.

17. The one-person-portable command and control data center of claim 9 further comprising:
an air traffic control software suite comprising a workstation operating system, a server operating system, a plurality of networking applications, a software defined radio application, a plurality of communication applications configured so as to send data to and receive data from surrounding centers, tracons, towers, and aircraft, a signal interference detection and countering application, a geo location application, a plurality of mapping applications, a mission planning application, a common operating picture application configured so as to identically display relevant information across a plurality of users, a plurality of reporting applications, a plurality of graphics display applications configured so as to display airspace boundaries, arrival and departure routes, track data and current aircraft positions, flight plans, aircraft ID, reported altitude, assigned altitude, ground speed, metering, arrival, and departure lists, weather information, and electronic flight strips, a weather forecasting and display application, a plurality of system security applications, an air traffic control application configured so as to provide track prediction, conflict probe and alert functionality, resolution advisories, minimum safe altitude advisory warnings, and time-based arrival and departure metering, a data recording, reduction and analysis application configured so as to record and facilitate analysis of any and all aircraft flight, track, display, and controller input, internal process functionality, interprocess communication, inter-center and inter-tracon communications.

18. The one-person-portable command and control data center of claim 4 further comprising:
a gaming network software suite comprising a workstation operating system, a server operating system, a plurality of networking applications, a plurality of communication applications, a signal interference detection and countering application, a geo location application, a plurality of motion imagery applications, a plurality of reporting applications, a plurality of graphics display applications, a plurality of graphics editing applications, a plurality of system security applications, a game server application, a plurality of game clients.

19. The one-person-portable command and control data center of claim 9 further comprising:
a gaming network software suite comprising a workstation operating system, a server operating system, a plurality of networking applications, a plurality of communication applications, a signal interference detection and countering application, a geo location application, a plurality of motion imagery applications, a plurality of reporting applications, a plurality of graphics display applications, a plurality of graphics editing applications, a plurality of system security applications, a game server application, a plurality of game clients.

20. The one-person-portable command and control data center of claim 4 wherein said case integrates a conductive material configured so as to create a Faraday cage.

21. The one-person-portable command and control data center of claim 9 wherein said case integrates a conductive material configured so as to create a Faraday cage.

22. A method for designing a one-person-portable command and control data center comprising the steps of:
determining a desired command and control capability set;
determining a set of hardware parameters required to provide said desired command and control capability set;
recognizing a first design limitation requiring a plurality of hardware components be disposed within a case defined by a first monitor's set of dimensions such that said case has a height of 1.06 times said first monitor's height, a length of 1.08 times said first monitor's length, and a depth of 11.25 said first monitor's depth;
recognizing a second design limitation requiring a total weight of said case and said plurality of hardware components be less than fifty pounds;
said plurality of hardware components comprising a user configurable power supply, a workstation motherboard, a server motherboard, a plurality of data storage devices, a radio transceiver, a five-port 10/100/1000 Mb/sec switch, a fiber optic network card, a sealed liquid cooling system, a positioning system receiver, a counter interference-signal transmitter, a low frequency radio, a 2.4 GHz transmitter receiver, said first monitor, a second monitor, a first hinged monitor support plate, a third monitor, a second hinged monitor support plate, a first pivot hinge, a second pivot hinge, a third pivot hinge, a fourth pivot hinge, and a removable keyboard;
selecting said motherboards having a plurality of 3D video cards so as to satisfy graphics processing unit requirements comprising a minimum of 768 parallel computing platform and application programming interface cores with a minimum of 134 GB/s of memory bandwidth and three direct simultaneous displays;
determining heat produced by said plurality of hardware components;
identifying thermal performance limits or thresholds for said components;
said thermal performance limits comprising a CPU operating temperature less than 75 C, a video card operating temperature less than 95 C, and an overall motherboard operating temperature less than 88 C;
identifying a range of optimal thermal operating parameters comprising a CPU optimal operating temperature range of 20 C to 32 C, a video card optimal operating temperature range of 20 C to 30 C, and an overall motherboard optimal operating temperature range of 20 C to 53 C;
determining a heat transfer capacity/absorption capacity required to maintain said components within said thermal performance limits or thresholds;
determining a design structure for said case for said plurality of hardware components comprising a horizontal top opposed opposite a horizontal bottom, a first vertical side coupled to said horizontal top and said horizontal bottom, a second vertical side opposed opposite said first vertical side and coupled to said horizontal top and said horizontal bottom, a vertical back plate coupled to said horizontal top, said horizontal bottom, said first vertical side, and said second vertical slide, a vertical front plate disposed opposite said vertical back plate coupled to said horizontal top, said horizontal bottom, said first vertical side, and said second vertical slide;
selecting a disposition and position for said plurality of hardware components in said case based in part on said thermal limit thresholds so that said components will operate within said case within said thermal limit thresholds while said components are operated within a predetermined external temperature range less than 81.2 C;
determining a design structure for a sealed liquid cooling system capable of maintaining said components within said thermal limits in air with an ambient temperature less than 81.2 C, comprising a quantity of heat transfer fluid, a radiator having a plurality of pipe coupling ports, a first fluid input pipe, a second fluid input pipe, a first fluid output pipe, a second fluid output pipe, a first heat sink and pump, a second heat sink and pump, a third heat sink and pump, and a plurality of wires configured to transmit an activation signal from said motherboards; wherein said fluid input pipes and said fluid output pipes are coupled to said radiator pipe coupling ports, said first heat sink and pump is disposed in contact with said first central processing unit, said second heat sink and pump is disposed in contact with said second central processing unit, said first and second heat sink and pumps are coupled to said first fluid input pipe, to said first fluid output pipe, and to a portion of said wires, said third heat sink and pump is disposed in contact with said workstation central processing unit; said third heat sink and pump is coupled to said second fluid input pipe, to said second fluid output pipe, and to a portion of said wires;
optimizing said liquid cooling system so as to allow a quantity of waste heat to pass from said central processing units to a portion of said heat transfer fluid, said portion of heat transfer fluid to be transported within said fluid input pipes to said radiator, said radiator being configured to allow a quantity of waste heat to pass from said portion of heat transfer fluid to a portion of proximal ambient air, said portion of heat transfer fluid to be transported within said fluid output pipes to said heat sinks and pumps;
selecting a disposition location within said case for said radiator so as to enable said radiator to passively power a convection current as said heated portion of proximal air rises within said case and exits said case through a plurality of first apertures or air pathways within said case and a portion of cooler ambient temperature air is drawn through a plurality of second apertures or air pathways in a lower portion of said second vertical side to draw air towards a resultant low pressure area proximal to said radiator;
selecting a software suite optimized for said desired command and control capability set.

23. A method for assembling a one-person-portable command and control data center comprising the steps of:

providing a case with a horizontal top opposed opposite a horizontal bottom, a first vertical side coupled to said horizontal top and said horizontal bottom, a second vertical side opposed opposite said first vertical side and coupled to said horizontal top and said horizontal bottom, a vertical back plate coupled to said horizontal top, said horizontal bottom, said first vertical side, and said second vertical slide, a vertical front plate disposed opposite said vertical back plate coupled to said horizontal top, said horizontal bottom, said first vertical side, and said second vertical slide;

forming said case so that said case has a height of 1.06 times a first monitor's height, a length of 1.08 times said first monitor's length, and a depth of 11.25 said first monitor's depth;

coupling a carrying handle to an exterior face of said horizontal top at a balance point selected to allow said case to be carried in one hand;

forming said first vertical side with a plurality of apertures;

forming said second vertical side with a plurality of apertures;

providing a user configurable power supply;

coupling said power supply to an inner face of said case;

configuring said power supply so as to accept a variety of power inputs and convert said inputs into an output signal with a waveform of 110 v at 60 Hz and 15 amps;

providing a workstation motherboard comprising a workstation central processing unit, a plurality of random access memory chips, and a first 3D video card;

coupling said workstation motherboard to an inner face of said case;

providing a server motherboard comprising a first central processing unit, a second central processing unit, a plurality of random access memory chips, and a second 3D video card;

disposing said server motherboard parallel to said workstation motherboard at a location so as to create a separation of less than 1.8 inches between a face of said workstation motherboard and a face of said server motherboard;

providing a formed tray, disposed in proximity to said second vertical side, and securing said formed tray by a quick release mechanism;

securing a plurality of data storage devices to said formed tray and connecting said data storage devices to one or more said motherboards;

providing a radio transceiver comprising an antenna port accessible through a selected aperture in said first vertical side, coupling said radio transceiver to an inner face of said case, and connecting said radio transceiver to said workstation motherboard;

providing a five-port 10/100/1000 Mb/sec switch comprising a plurality of ports accessible through a selected aperture in said first vertical side, coupling said five-port 10/100/1000 Mb/sec switch to an inner face of said case, and connecting said five-port 10/100/1000 Mb/sec switch to said server motherboard and to said workstation motherboard;

providing a fiber optic network card comprising a plurality of ports accessible through a selected aperture in said first vertical side, coupling said fiber optic network card to an inner face of said case, and connecting said fiber optic network card to either of said motherboards;

providing a sealed liquid cooling system comprising a quantity of heat transfer fluid, a radiator having a plurality of pipe coupling ports, a first fluid input pipe, a second fluid input pipe, a first fluid output pipe, a second fluid output pipe, a first heat sink and pump, a second heat sink and pump, a third heat sink and pump, and a plurality of wires configured to transmit an activation signal from said motherboards;

coupling said fluid input pipes and said fluid output pipes to said radiator pipe coupling ports;

disposing said first heat sink and pump in contact with said first central processing unit;

disposing said second heat sink and pump in contact with said second central processing unit;

coupling said first and second heat sink and pumps to said first fluid input pipe, to said first fluid output pipe, and to a portion of said wires;

disposing said third heat sink and pump in contact with said workstation central processing unit;

coupling said third heat sink and pump to said second fluid input pipe, to said second fluid output pipe, and to a portion of said wires;

disposing said radiator within three 5.25 inch drive bays proximal to said horizontal bottom and said second vertical side and entirely within said case;

configuring said sealed liquid cooling system so as to allow a quantity of waste heat to pass from said central processing units to a portion of said heat transfer fluid, said portion of heat transfer fluid to be transported within said fluid input pipes to said radiator, said radiator being configured to allow a quantity of waste heat to pass from said portion of heat transfer fluid to a portion of proximal ambient air, said portion of heat transfer fluid to be transported within said fluid output pipes to said heat sinks and pumps;

configuring said radiator so as to passively power a convection current as said heated portion of proximal air rises within said case and exits said case through a plurality of first apertures and air pathways and a portion of cooler ambient temperature air is drawn through an a plurality of second apertures and air pathways in a lower portion of said second vertical side to draw air towards a low pressure area proximal to said radiator along a convection air current path;

providing a positioning system receiver comprising an antenna port accessible through a selected aperture in said first vertical side, securing said positioning system receiver within said case, and connecting said positioning system receiver to said server motherboard;

providing a counter interference-signal transmitter comprising an antenna port accessible through a selected aperture in said first vertical side, securing said counter interference-signal transmitter within said case and connecting said counter interference-signal transmitter to said workstation motherboard;

scanning for interference signals;

configuring said counter interference-signal transmitter so as to produce a signal capable of defeating detected interference signals;

providing a low frequency radio comprising an antenna port accessible through a selected aperture in said first vertical side, securing said low frequency radio within said case, and connecting said low frequency radio to said workstation motherboard;

providing a 2.4 GHz transmitter receiver comprising an antenna port accessible through a selected aperture in said first vertical side, securing said 2.4 GHz transmitter receiver within said case, and connecting said 2.4 GHz transmitter receiver to said workstation motherboard;

securing said first monitor to a monitor bracket coupled to said vertical front plate;
connecting said first monitor to said first 3D video card and to said user configurable power supply;
securing a second monitor to a first hinged monitor support plate;
connecting said second monitor to said first 3D video card, and to said user configurable power supply;
coupling said first hinged monitor support plate by a first pivot hinge to an interior face of said horizontal top and by a second pivot hinge to an interior face of said horizontal bottom;
configuring said first hinged monitor support plate so as to enable said second monitor to be folded through an arc from an extend position in line with said first monitor, toward said first monitor, to a position parallel to, and in contact with said first monitor, creating a first closed position;
securing a third monitor to a second hinged monitor support plate;
connecting said third monitor to said first 3D video card, and to said user configurable power supply;
coupling said second hinged monitor support plate by a third pivot hinge to an interior face of said horizontal top and by a fourth pivot hinge to an interior face of said horizontal bottom;
configuring said second hinged monitor support plate so as to enable said third monitor to be folded through an arc from an extend position in line with said first monitor, toward said second monitor to a position parallel to, and in contact with said second monitor in said first closed position, creating a second closed position;
providing a plurality of fixtures configured to support a removable keyboard;
disposing said plurality of fixtures on said second hinged monitor support plate on a face opposite said third monitor;
providing said removable keyboard comprising a plurality of locking pins disposed so as to penetrate a matching plurality of said support fixtures and create a secure coupling between said keyboard and said second hinged monitor support plate;
providing a first radio antenna formed with a plurality of facets;
configuring said first radio antenna to transmit or receive in a radio spectrum between 1 MHz and 6 GHz;
connecting said first radio antenna to said radio transceiver antenna port and said counter interference-signal transmitter antenna port;
connecting an active positioning antenna to said positioning system receiver antenna port;
connecting and configuring a second radio antenna to said 2.4 GHz transmitter receiver antenna port so as to support a wireless information network;
providing a third radio antenna configured to transmit or receive in a radio spectrum between 30 kHz and 300 kHz;
connecting said third radio antenna to said low frequency radio antenna port;
providing a wideband ground communication antenna;
connecting said wideband ground communication antenna to said five-port 10/100/1000 Mb/sec switch;
configuring said wideband ground communication antenna so as to receive data feeds from airborne or space-based platforms;
connecting a plurality of client workstations to said five-port 10/100/1000 Mb/sec switch;
identifying a mission scenario in which said one-person-portable command and control data center will be employed;
providing a software suite optimized for said mission scenario.

* * * * *